US008310055B2

(12) United States Patent
Park et al.

(10) Patent No.: US 8,310,055 B2
(45) Date of Patent: Nov. 13, 2012

(54) SEMICONDUCTOR DEVICES HAVING NARROW CONDUCTIVE LINE PATTERNS AND RELATED METHODS OF FORMING SUCH SEMICONDUCTOR DEVICES

(75) Inventors: Young-ju Park, Seoul (KR); Jae-ho Min, Seoul (KR); Myeong-cheol Kim, Gyeonggi-do (KR); Dong-chan Kim, Seoul (KR); Jae-hwang Sim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 211 days.

(21) Appl. No.: 12/645,820

(22) Filed: Dec. 23, 2009

(65) Prior Publication Data

US 2010/0155959 A1 Jun. 24, 2010

(30) Foreign Application Priority Data

Dec. 24, 2008 (KR) .................. 10-2008-0133835

(51) Int. Cl.
*H01L 23/522* (2006.01)
*H01L 21/768* (2006.01)
(52) U.S. Cl. ........ 257/773; 257/734; 257/775; 257/786; 257/E23.142; 257/E23.151; 257/E23.153; 257/E21.595; 438/666; 438/669
(58) Field of Classification Search .............. 257/734, 257/773, 775, 786, E23.142, E23.151, E23.153; 438/666, 669
See application file for complete search history.

(56) References Cited

U.S. PATENT DOCUMENTS

| | | | | |
|---|---|---|---|---|
| 5,635,737 | A | * | 6/1997 | Yin ............................... 257/204 |
| 6,472,745 | B1 | * | 10/2002 | Iizuka ........................... 257/723 |
| 7,115,525 | B2 | | 10/2006 | Abatchev et al. |
| 2003/0218246 | A1 | * | 11/2003 | Abe et al. ...................... 257/734 |
| 2006/0022311 | A1 | * | 2/2006 | Lin .............................. 257/649 |

FOREIGN PATENT DOCUMENTS

JP 2007-150166 6/2007
KR 1020060113162 A 11/2006

* cited by examiner

*Primary Examiner* — Peniel M Gumedzoe
(74) *Attorney, Agent, or Firm* — Myers Bigel Sibley & Sajovec

(57) ABSTRACT

Semiconductor devices and methods of forming semiconductor devices are provided in which a plurality of patterns are simultaneously formed to have different widths and the pattern densities of some regions are increased using double patterning. The semiconductor device includes a plurality of conductive lines each including a first line portion and a second line portion, where the first line portion extends on a substrate in a first direction, the second line portion extends from one end of the first line portion in a second direction, and the first direction is different from the second direction; a plurality of contact pads each of which is connected with a respective conductive line of the plurality of conductive lines via the second line portion of the corresponding conductive line; and a plurality of dummy conductive lines each including a first dummy portion extending from a respective contact pad of the plurality of contact pads, in parallel with the corresponding second line portion in the second direction.

20 Claims, 24 Drawing Sheets

SEMICONDUCTOR DEVICES HAVING NARROW CONDUCTIVE LINE PATTERNS AND RELATED METHODS OF FORMING SUCH SEMICONDUCTOR DEVICES

CROSS-REFERENCE TO RELATED APPLICATIONS

This application claims the benefit under 35 U.S.C. §119 of Korean Patent Application No. 10-2008-0133835, filed on Dec. 24, 2008, in the Korean Intellectual Property Office, the disclosure of which is incorporated herein in its entirety by reference as if set forth fully herein.

BACKGROUND

The present invention relates to semiconductor devices and, more particularly, to semiconductor devices having conductive line patterns and to related methods of forming such devices.

Highly integrated semiconductor devices may include patterns with various widths, including very small patterns that have a pitch that may be less than the resolution limit of a photolithography process and patterns having a relatively large pitch which can be obtained using the photolithography process.

SUMMARY

Pursuant to embodiments of the present invention, semiconductor devices are provided that include a plurality of conductive lines, each of which has a first line portion and a second line portion, where the first line portion extends on a substrate in a first direction, the second line portion extends from an end of the first line portion in a second direction, and the first direction is different from the second direction. These semiconductor devices further include a plurality of contact pads, each of which is directly connected to the second line portion of a respective one of the plurality of conductive lines, and a plurality of dummy conductive lines, each of which includes a first dummy portion that extends from a respective one of the plurality of contact pads in the second direction.

The plurality of conductive lines may include adjacent first and second conductive lines. The contact pads may include a first contact pad that is directly connected to the first conductive line and a second contact pad that is directly connected to the second conductive line. The first contact pad may be directly connected to a first dummy conductive line and the second contact pad may be directly connected to a second dummy conductive line. The first dummy conductive line may have a different shape than the second dummy conductive line. Moreover, at least one of the first and second dummy conductive lines may include a second dummy portion that extends from one end of the first dummy portion in a third direction, where the third direction is different from the second direction.

The conductive lines may include adjacent first and second conductive lines. The contact pads may include a first contact pad that is directly connected to the first conductive line, and a second contact pad that is directly connected to the second conductive line. Only one of the first contact pad and the second contact pad may be connected to one of the dummy conductive lines. Moreover, each of the dummy conductive lines may further include a second dummy portion extending from one end of the first dummy portion in a third direction, where the third direction is different from the second direction.

Each of the contact pads may include a linear edge portion extending in the second direction, and the second line portion of some of the conductive lines may extend to form a straight line together with the linear edge portion of a respective one of the contact pads. Each contact pad that has a linear edge portion that together with the second line portion of one of the conductive lines forms a straight line may, in some embodiments, also be connected to a respective one of the dummy conductive lines. Each contact pad that has a linear edge portion that together with the second line portion of one of the conductive lines forms a straight line may include a non-linear edge portion adjacent to the second line portion. The linear edge portion and the non-linear edge portion may be spaced apart from each other, and the second line portion may be disposed between the linear edge portion and the non-linear edge portion.

In embodiments that include adjacent first and second conductive lines, the contact pads may include a first contact pad that is connected to the first conductive line and a second contact pad that is connected to the second conductive line. Each of the first and second contact pads may include an edge portion that extends in the second direction. The second line portion of only one of the first and second conductive lines may include straight sidewall that extends to form a straight line together with the edge portion. Each contact pad that has a linear edge portion that together with the second line portion of one of the conductive lines forms a straight line may also, in some embodiments, be connected to one of the dummy conductive lines.

The first line portions of the conductive lines may extend in parallel with one another while being spaced apart from one another by a first distance. For each of the contact pads, the second line portion of the respective conductive line that is connected to the contact pad is spaced apart from the respective dummy conductive line that is connected to the contact pad by a distance that is greater than the first distance.

In embodiments that include adjacent first and second conductive lines, the contact pads may include a first contact pad that is connected to the first conductive line and a second contact pad that is connected to the second conductive line. The length of the second line portion of the first conductive line may be different from the length of the second line portion of the second conductive line.

Pursuant to further embodiments of the present invention, methods of forming semiconductor devices are provided in which a conductive layer having a first region, a second region and a third region connecting the first and second regions is formed on a substrate. A dual mask layer is formed on the conductive layer that covers the first region, the second region and the third region. The dual mask layer is patterned to form first, second and third mask patterns on the respective first, second and third regions, where the first through third mask patterns are connected to one another and the width of the second mask pattern is greater than the width of the first mask pattern. First, second and third spacers are formed, where the first spacer covers sidewalls of the first mask pattern, the second spacer covers sidewalls of the second mask pattern, and the third spacer covers sidewalls of the third mask pattern. The first and third mask patterns are removed while retaining the second mask pattern. Finally, the conductive layer is patterned using the first, second and third spacers as etch masks to form a conductive pattern that extends from the first region to the third region.

The conductive pattern may include a plurality of conductive lines, each of which has a first line portion extending in the first region in a first direction and a second line portion extending from one end of the first line portion in the third region in a second direction, where the first direction is different from the second direction; a plurality of contact pads in the second region, where each of the contact pads is connected to a respective conductive line of the plurality of conductive lines via the second line portions of the corresponding conductive line; and a plurality of dummy conductive lines formed in the third region, where each dummy conductive line has a first dummy portions that extends from a respective one of the plurality of contact pads in the second direction.

Pursuant to these methods, the first, second and third mask patterns may be formed by forming first, second and third variable mask patterns on the dual mask layer, where the first variable mask pattern is disposed in the first region, the second variable mask pattern is disposed in the second region, and the third variable mask pattern is disposed in the third region. The first, second and third mask patterns may be simultaneously formed by etching the dual mask layer using the first through third variable mask patterns as etch masks, under etch conditions in which the amount of abrasion of the variable mask pattern is greater than the amount of abrasion of the second variable mask pattern, wherein the first mask pattern has a first top surface covered by the first variable mask pattern, the second mask pattern has a second top surface covered by the second variable mask pattern, and the third mask pattern has a third top surface covered by the third variable mask pattern.

After forming the first, second and third mask patterns and before forming the first, second and third spacers, the method may further include exposing the first top surface of the first mask pattern by removing the first variable mask pattern. The forming of the first, second and third spacers may include forming a spacer mask layer to cover the sidewalls and first top surface of the first mask pattern, the sidewalls of the second mask pattern, an exposed surface of the second variable mask pattern, an exposed surface of the third mask pattern, and an exposed surface of the third variable mask pattern; and forming the first through third spacers from a remnant portion of the spacer mask layer by etching the spacer mask layer.

After forming the first, second and third spacers and before removing the first mask pattern, the method may further include exposing the first top surface of the first mask pattern by removing the first variable mask pattern.

During the forming of the first, second and third spacers, the first through third spacers may be formed to be connected to one another.

After removing the first and third mask patterns and before forming the conductive pattern, the method may further include performing a trimming process in which a first portion of the first spacer and a second portion of the third spacer are removed to divide the connected first, second and third spacers into two parts. The trimming process may also involve removing a third portion of the second spacer.

The substrate may further include a fourth region for trimming, and in the forming of the first, second and third mask patterns, a fourth mask pattern may be further formed to be disposed in the fourth region. In the forming the first, second and third spacers, a fourth spacer may further be formed to cover sidewalls of the fourth mask pattern. The first through third spacers may be formed to be connected to one another in a ring fashion. After removing the first and third mask patterns and before forming the conductive pattern, the method may further include performing a trimming process in which the first through third spacers connected in the ring fashion are divided into two parts. In the trimming process, a first portion consisting of the first spacer and a second portion consisting of the fourth spacer may be removed from the first through fourth spacers connected in the ring fashion.

Pursuant to still further embodiments of the present invention, methods of patterning a conductive layer to form first and second conductive lines and first and second contact pads are provided. Pursuant to these methods, a mask layer is formed on the conductive layer. The mask layer is then patterned to form a spacer mask pattern on a first portion of the conductive layer, a first contact pad mask pattern in a second portion of the conductive layer and a second contact pad mask pattern in a third portion of the conductive layer. The conductive layer is patterned to simultaneously form the first conductive line directly adjacent to a first side of the spacer mask pattern, the second conductive line directly adjacent to a second side of the spacer mask pattern, the first contact pad under the first contact pad mask pattern and the second contact pad under second contact pad mask pattern.

In some embodiments, the method may further include forming first spacers that cover sidewalls of the spacer mask pattern, a second spacer that covers sidewalls of the first contact pad mask pattern, a third spacer that covers sidewalls of the second contact pad mask pattern, and a fourth spacer that connects the second and third spacers, where the first spacer is used as an etching mask for forming the first conductive line during the patterning of the conductive layer and the second spacer is used as an etching mask for forming the second conductive line during the patterning of the conductive layer. The method may also include a trimming process that is performed to remove a portion of the fourth spacer. In such methods, the first contact pad mask pattern and the second spacer may be used as an etch mask to form the first contact pad during the patterning of the conductive layer, and the second contact pad mask pattern and the third spacer may be used as an etch mask to form the second contact pad during the patterning of the conductive layer.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EMBODIMENTS

Figure 1:
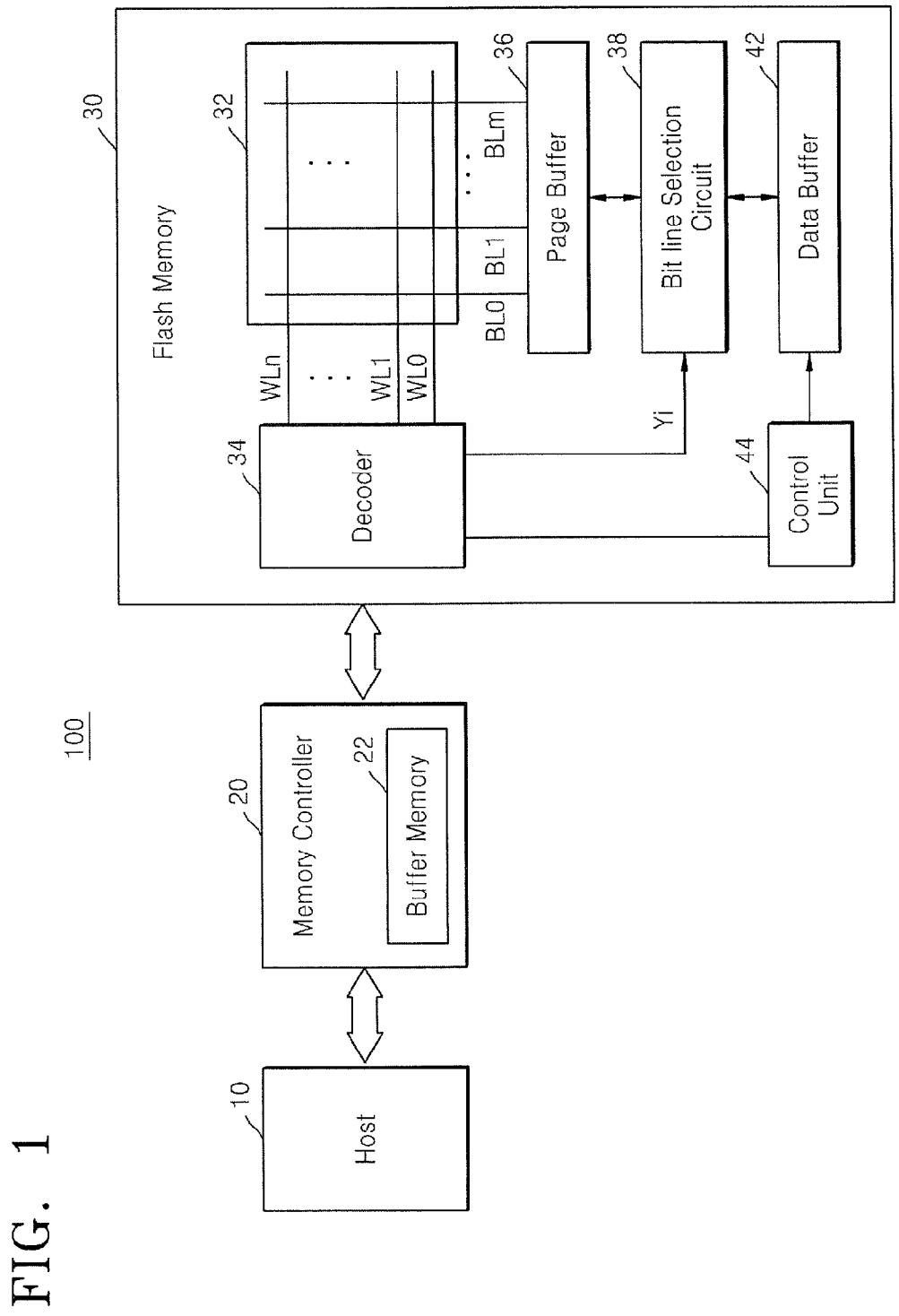
FIG. 1 is a schematic block diagram of a memory system for a semiconductor device according to certain embodiments of the present invention.

Hereinafter, exemplary embodiments of the present invention will be described in greater detail with reference to the accompanying drawings. However, the present invention may be embodied in many different forms and should not be construed as being limited to the embodiments set forth herein. Rather, these embodiments are provided so that this disclosure will be thorough and complete and will fully convey the concept of the invention to those skilled in the art. The same reference numerals represent the same elements throughout the drawings. For convenience of explanation, various elements and regions are schematically illustrated, and thus, the inventive concept is not limited thereto.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the tenor "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that teens used herein should be interpreted as having a meaning that is consistent with their meaning in the context of this disclosure and the relevant art and will not be interpreted in an idealized or overly formal sense unless expressly so defined herein.

FIG. 1 is a schematic block diagram of a memory system 100 for a semiconductor device according to embodiments of the present invention. The memory system 100 includes a host 10, a memory controller 20, and a flash memory 30.

The memory controller 20 functions as an interface between the host 10 and the flash memory 30, and includes a buffer memory 22. Although not illustrated in FIG. 1, the memory controller 20 may further include a central processing unit (CPU), a read only memory (ROM), a random access memory (RAM), interface blocks and/or other elements.

The flash memory 30 may include a cell array 32, a decoder 34, a page buffer 36, a bit line selection circuit 38, a data buffer 42, and a control unit 44.

In operation, data and a write command may be input from the host 10 to the memory controller 20, and the memory controller 20 controls the flash memory 30 so that the data may be written to the cell array 32, in response to the write command. The memory controller 20 likewise may control the flash memory 30 so that data may be read from the cell array 32, in response to a read command from the host 10. The buffer memory 22 temporarily stores data exchanged between the host 10 and the flash memory 30.

The cell array 32 of the flash memory 30 includes a plurality of memory cells. The decoder 34 is connected to the cell array 32 via word lines WL0, WL1, . . . , through WLn. The decoder 34 receives an address from the memory controller 20, and either selects one word line from among the word lines WL0, WL1, . . . , through WLn or generates a selection signal Yi for selecting one bit line from among bit lines BL0, BL1, . . . , through BLm. The page buffer 36 is connected to the cell array 32 via the bit lines BL0, BL1, . . . , through BLm.

Figure 2:
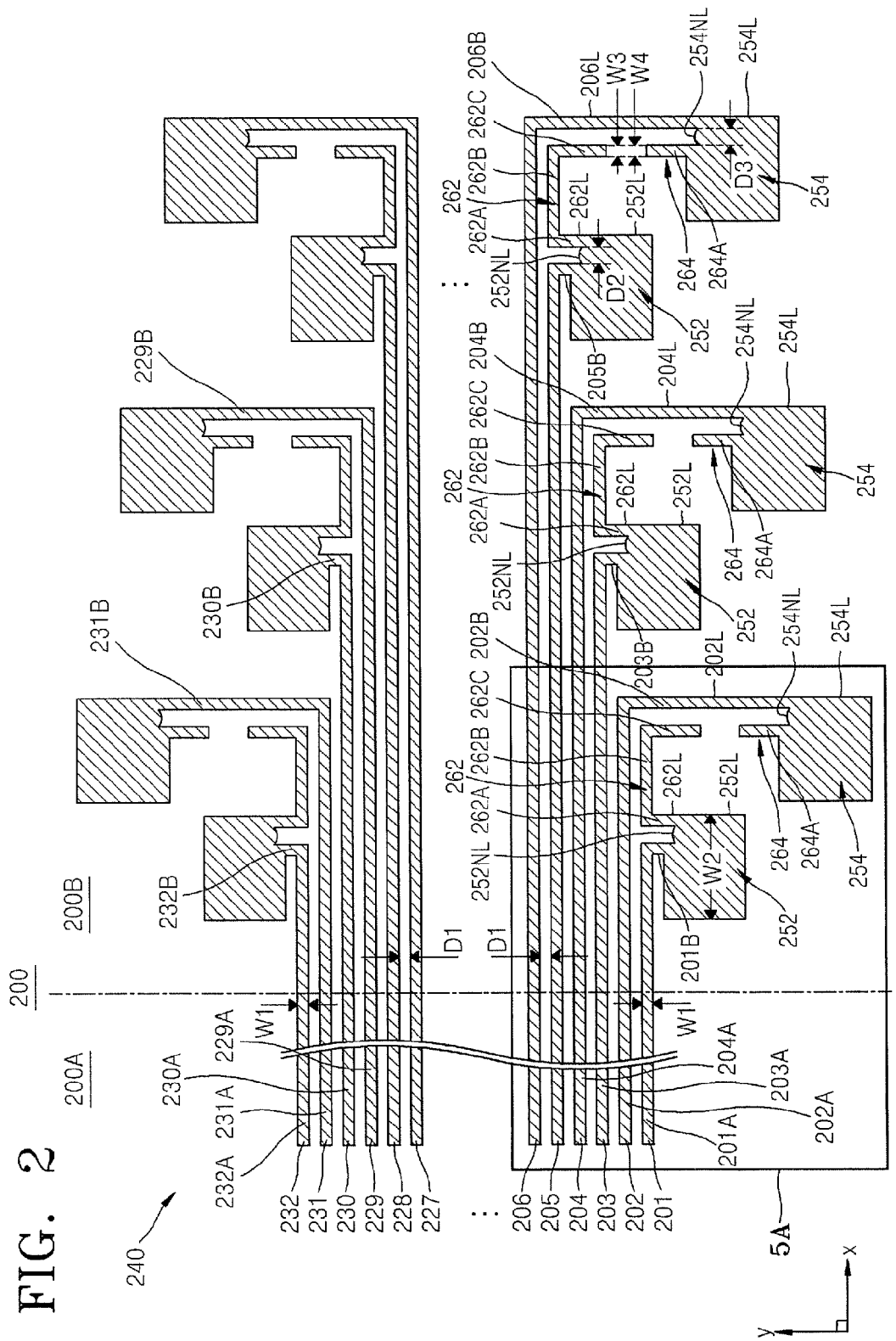
FIG. 2 is a layout diagram of a portion a semiconductor device according to embodiments of the present invention.

FIG. 2 is a layout diagram of a portion of a semiconductor device 200 according to embodiments of the present invention. The semiconductor device 200 may be a NAND flash memory device. FIG. 2 illustrates the layout of a portion of a memory cell region 200A of the semiconductor device 200 and a portion of a connection region 200B in which a plurality of conductive lines (e.g., word lines or bit lines) connect to respective contact pads to provide connections to an external circuit (not shown) such as a decoder in a peripheral circuit region (not shown). The memory cell region 200A may constitute the cell array 32 of FIG. 1.

The memory cell region 200A includes a plurality of memory cell blocks 240, only one of which is shown in FIG. 2. In the memory cell block 240, a plurality of conductive lines 201, 202, . . . , through 232 that form one cell string extend in parallel in a first direction (in the X-axis direction in FIG. 2). The conductive lines 201, 202, . . . , through 232 are disposed in both the memory cell region 200A and the connection region 200B.

The conductive lines 201, 202, . . . , through 232 include respective first line portions 201A, 202A, . . . , through 232A that extend in the first direction, and respective second line portions 201B, 202B, . . . , through 232B that extend from one end of the corresponding first line portions 201A, 202A, . . . , through 232A in a second direction (in the Y-axis direction in FIG. 2). The second direction is different from the first direction. The first line portions 201A, 202A, . . . , through 232A are disposed in the memory cell region 200A and the connection region 200B. The second line portions 201B, 202B, ..., through 232B are disposed only in the connection region 200B. Although FIG. 2 illustrates a case where the second direction intersects the first direction at a right angle, it will be appreciated that the first and second directions may intersect at other angles.

In the connection region 200B, a plurality of contact pads 252 and a plurality of contact pads 254 are formed that are connected to respective of the conductive lines 201, 202, ..., through 232. The contact pads 252 and 254 are connected to the ends of the second line portions 201B, 202B, ..., through 232B that are opposite to the ends thereof which are connected to the first line portions 201A, 202A, ..., through 232A.

Referring to FIG. 2, the lengths of the second line portions 201B, 203B, ..., through 232B of the conductive lines 201, 203, ..., through 232 that are connected to the contact pads 252 differ from the lengths of the second line portions 202B, 204B, ..., through 231B of the respective conductive lines 202, 204, ..., through 231 that are connected to the contact pads 254. However, the present invention is not limited to this structure, and the lengths of the second line portions 201B, 203B, ..., through 232B may be the same as the lengths of the second line portions 202B, 204B, ..., through 231B according to further embodiments of the present invention.

In the connection region 200B, each contact pad 252 is connected to a respective one of a plurality of dummy conductive lines 262, and each contact pad 254 is connected to a respective one a plurality of dummy conductive lines 264. Each dummy conductive line 262 includes a first dummy portion 262A that extends in the second direction, and each dummy conductive line 264 similarly includes a first dummy portion 264A that extends in the second direction. Thus, the first dummy portions 262A and 264A extend parallel to the second line portions 201B, 202B, ..., though 232B. FIG. 2 illustrates a case where all the contact pads 252 and 254 are connected to a respective one of the dummy conductive lines 262 or 264. However, the present invention is not limited to this structure, and in other embodiments only some of the contact pads 252 and/or 254 may be connected to the dummy conductive lines 262 and 264 as will be described, for example, with reference to FIG. 3.

In the connection region 200B of FIG. 2, each of the conductive lines 201, 202, ..., through 232 that is connected to a respective one of the contact pads 252 is adjacent to another of the conductive lines 201, 202, ..., through 232 that is connected to a respective one of the contact pads 254. As shown in FIG. 2, the shape of the dummy conductive line 262 may be different from the shape of the dummy conductive line 264. In particular, the dummy conductive line 262 may include the first dummy portion 262A, a second dummy portion 262B that extends from one end of the first dummy portion 262A in a third direction, and a third dummy portion 262C that extends from the second dummy portion 262B in a fourth direction, where the third direction is different from the second direction and the fourth direction is different from the third direction. In the particular embodiment depicted in FIG. 2, the third direction is identical to the first direction, and the fourth direction is identical to the second direction, but the inventive concept is not limited thereto. In the particular embodiment of FIG. 2, the dummy conductive line 264 includes only the first dummy portion 264A.

Each contact pad 252 has a linear edge portion 252L that extends in the second direction, and each contact pad 254 similarly has a linear edge portion 254L that extends in the second direction. The second line portions 202B, 204B, ..., through 231B of the respective conductive lines 202, 204, ..., 231 have straight sidewalls 202L, 204L, ..., through 231L that extend to form a straight line together with one of the linear edge portions 254L of the contact pads 254 that are connected to the respective second line portions 202B, 204B, ..., through 231B. FIG. 2 illustrates a case where the dummy conductive line 264 is connected to the contact pads 254 having the straight sidewalls 202L, 204L, ..., 231L. In other embodiments, the dummy conductive line 264 may be omitted, as will be described in detail with reference to FIG. 3.

The linear edge portion 252L of the contact pad 252 extends to form a straight line together with a straight sidewall 262L of the first dummy portion 262A of the dummy conductive line 262.

Each contact pad 252 and 254 may also have a non-linear edge portion 252NL or 254NL that are formed near one of the second line portions 201B, 202B, ..., through 232B of the conductive lines 201, 202, ..., through 232. For the contact pads 252, the non-linear edge portion 252NL is formed between one of the second line portions 201B, 203B, ..., through 231B and the first dummy portion 262A of the dummy conductive line 262. In the contact pad 252, the linear edge portion 252L and the non-linear edge portion 252NL may be spaced apart from each other, and the first dummy portion 262A of the dummy conductive line 262 may be disposed therebetween.

For the contact pads 254, the non-linear edge portion 254NL is formed between one of the second line portions 202B, 204B, ..., through 231B of the conductive lines 202, 204, ..., through 231 and the dummy conductive line 264. The linear edge portion 254L and the non-linear edge portion 254NL of each contact pad 254 may be spaced apart from each other, and one of the second line portions 202B, 204B, ..., through 231B of the conductive lines 202, 204, ..., through 231 may be disposed therebetween.

Referring to FIG. 2, the non-linear edge portions 252NL and 254NL have a convex shape with respect to the contact pads 252 and 254, respectively, but the present invention is not limited thereto. For example, in other embodiments, the non-linear edge portions 252NL and 254NL may have a concave shape, or a combination of a convex shape and a concave shape with respect to the contact pads 252 and 254, respectively.

The conductive lines 201, 202, ..., through 232 may have first width W1. The dummy conductive lines 262 and 264 may respectively have widths W3 and W4. The widths W3 and/or W4 may be equal to the first width W1.

In the memory cell region 200A and the connection region 200B, the first line portions 201A, 202A, ..., through 232A of the conductive lines 201, 202, ..., through 232 are separated from one another by a predetermined distance, i.e., a first distance D1, in the second direction. In the connection region 200B, the distance between the second line portions 201B, 203B, ..., through 232B and the first dummy portion 262A in the first direction may be a second distance D2. The second distance D2 may be equal to or greater than the first distance D1. Similarly, in the connection region 200B, the distance between the second line portions 202B, 204B, ..., through 231B and the first dummy portion 264A in the first direction may be a third distance D3 that is equal to or greater than the first distance D1. The second distance D2 and the third distance D3 may be equal to or different from each other.

In FIG. 2, the conductive lines 201, 202, ..., through 232 may be word lines or bit lines that are associated with a plurality of memory cells in the memory cell region 200A.

FIG. 2 illustrates that the memory cell block 240 includes thirty-two conductive lines 201, 202, . . . , through 232. However, it will be appreciated that other numbers of conductive lines may be provided in other embodiments.

Figure 3:
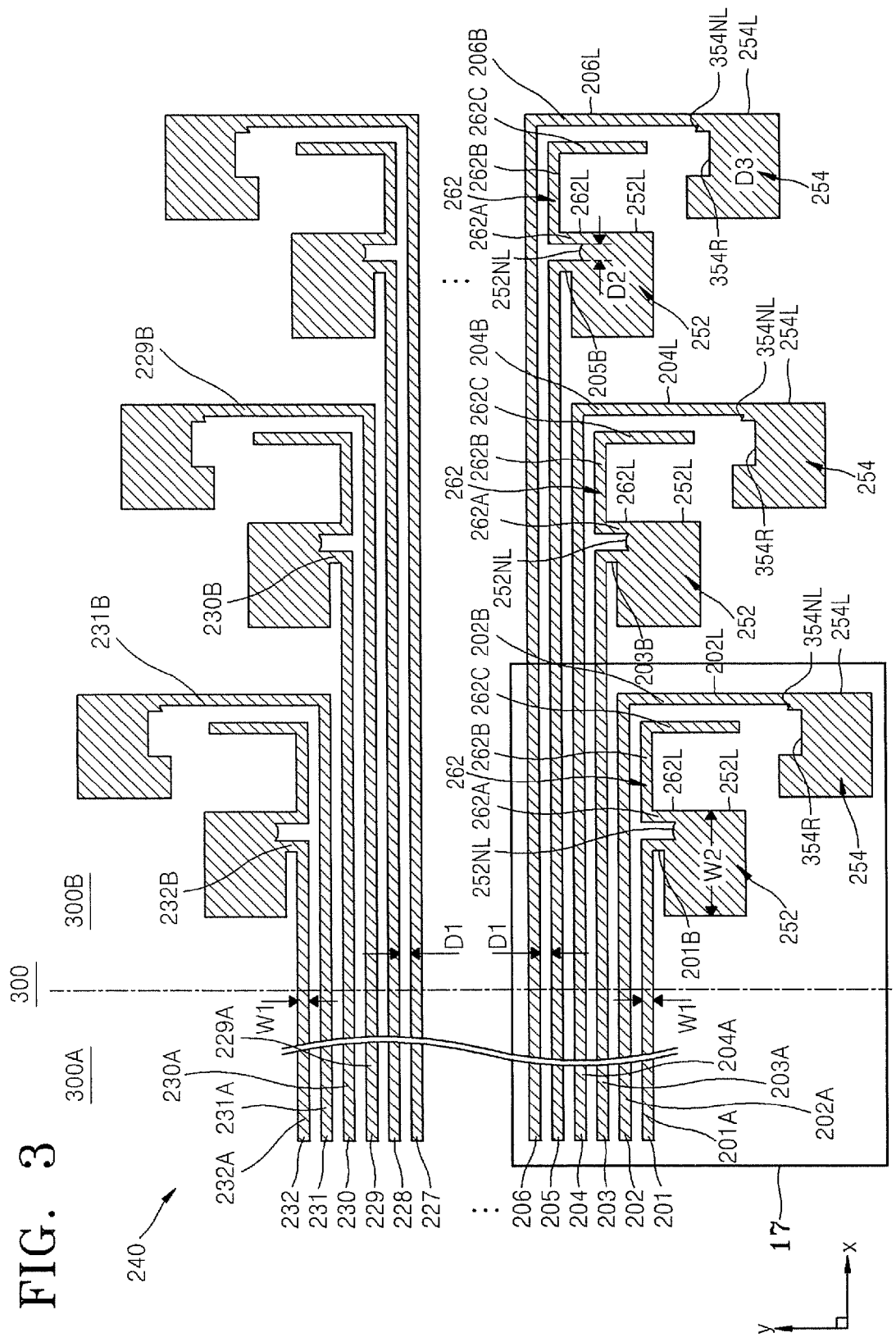
FIG. 3 is a layout diagram of a portion of a semiconductor device according to further embodiments of the present invention.

FIG. 3 is a layout diagram of a portion of a semiconductor device 300 according to further embodiments of the present invention. The semiconductor device 300 may be a NAND flash memory device. FIG. 3 illustrates the layout of a portion of a memory cell region 300A of the semiconductor device 300 and a part of a connection region 300B in which a plurality of conductive lines (e.g., word lines or bit lines) connect to respective contact pads to provide connections to an external circuit (not shown) such as a decoder in a peripheral circuit region (not shown). The memory cell region 300A may faun the cell array 32 of FIG. 1.

The semiconductor device 300 of FIG. 3 is similar to the semiconductor device 200 of FIG. 2 except that in the connection region 300B, each of the contact pads 254 does not include the dummy conductive line 264 illustrated in FIG. 2. In FIG. 3, reference numerals that are the same as those of FIG. 2 denote the same elements, and thus, a detailed description thereof will not be repeated here.

Referring to FIG. 3, in the connection region 300B, a plurality of contact pads 252 are respectively connected to a plurality of dummy conductive lines 262 having first dummy portions 262A that extend in parallel with second line portions 201B, 202B, . . . , through 232B in the second direction (the Y-axis direction in FIG. 3). However, the contact pads 254 are not connected to respective dummy conductive lines. In each of the contact pads 254, a recessed sidewall portion 354R may be formed near a non-linear edge portion 354NL that is near the second line portion 202B, 204B, . . . , or 231B of a plurality of conductive lines 202, 204, . . . , through 231. The remaining three sidewalls of each contact pad 254 are not recessed.

In each of the contact pads 254, the non-linear edge portion 354NL is formed between the second line portion 202B, 204B, . . . , through 231B that is connected to the contact pad 254 and the recessed sidewall portion 354R.

Figure 4:
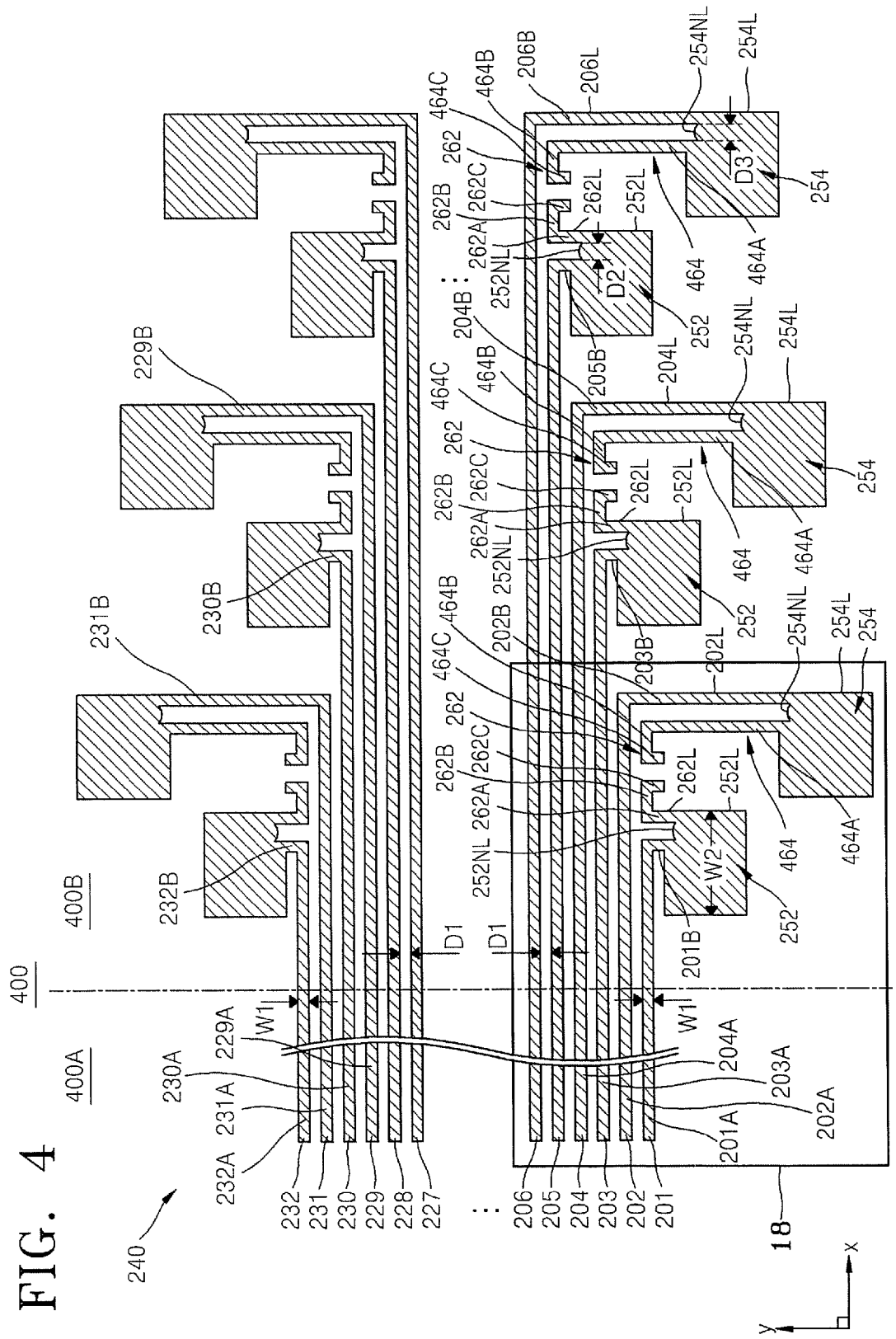
FIG. 4 is a layout diagram of a portion of a semiconductor device according to still further embodiments of the present invention.

FIG. 4 is a layout diagram of a portion of a semiconductor device 400 according to still further embodiments of the present invention. The semiconductor device 400 may be a NAND flash memory device. FIG. 4 illustrates the layout of a portion of a memory cell region 400A of the semiconductor device 400 and a part of connection region 400B in which a plurality of conductive lines (e.g., word lines or bit lines) connect to respective contact pads to provide connections to an external circuit (not shown) such as a decoder in a peripheral circuit region (not shown). The memory cell region 400A may form the cell array 32 of FIG. 1.

The semiconductor device 400 of FIG. 4 is similar to the semiconductor device 200 of FIG. 2 except that in the connection region 400B, each of a plurality of dummy conductive lines 464 that are connected to a plurality of contact pads 254 includes a first dummy portion 464A, a second dummy portion 464B extending from one end of the first dummy portion 464A in a third direction which is different from the second direction, and a third dummy portion 464C extending from the second dummy portion 464B in a fourth direction that is different from the third direction. In FIG. 4, reference numerals that are the same as those of FIG. 2 denote the same elements, and thus, a detailed description thereof will not be repeated here.

The first dummy portion 464A extends from the contact pad 254 in parallel with second line portions 202B, 204B, . . . , through 231B of conductive lines 202, 204, . . . , through 231. FIG. 4 illustrates a case where the third direction is identical to the first direction, and the fourth direction is identical to the second direction, but the present invention is not limited thereto.

The shape of each dummy conductive lines 262 is different from the shape of each dummy conductive line 464.

As shown in FIG. 4, a non-linear edge portion 254NL of each contact pad 254 is formed between one of the second line portions 202B, 204B, . . . , through 231B of the conductive lines 202, 204, . . . , 231 and the first dummy portion 464A of the dummy conductive line 464 that is connected to the contact pad 254.

Figure 5A:
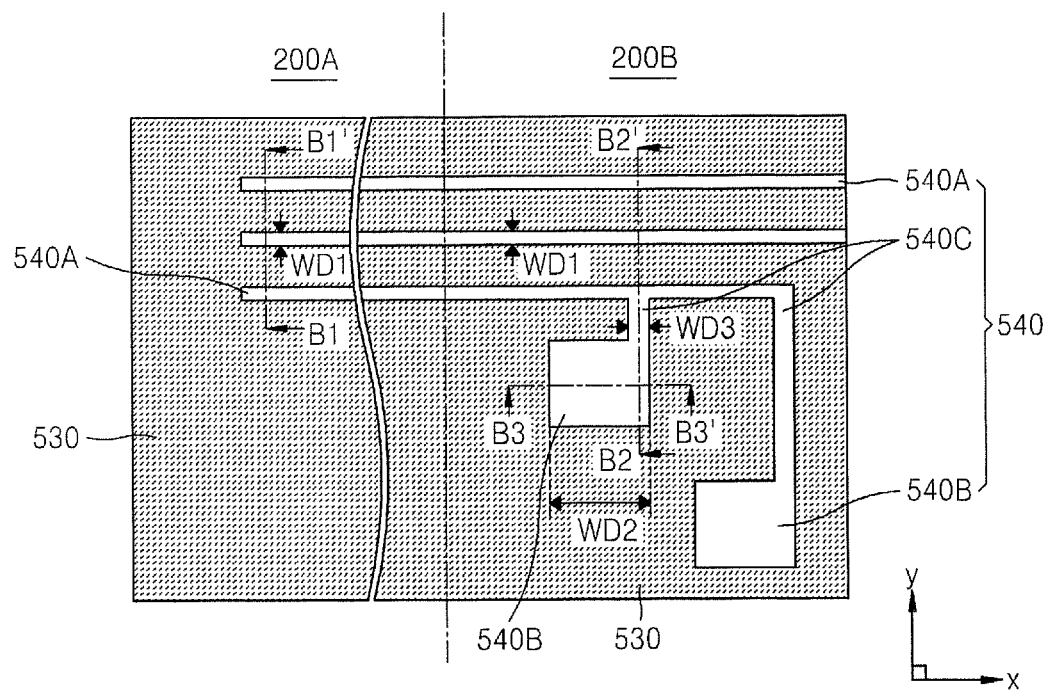
FIGS. 5A through 16B are plan and cross-sectional views illustrating methods of forming semiconductor devices according to embodiments of the present invention.

FIGS. 5A through 16B are plan and cross-sectional views illustrating methods of forming semiconductor devices according to embodiments of the present invention. These methods may be used to form, for example, the semiconductor device 200 of FIG. 2. FIGS. 5A, 6A, . . . , through 16A are plan views of the portion of FIG. 2 indicated by reference numeral "5A." FIGS. 5B, 6B, . . . through 16B are cross-sectional views respectively taken along the lines B1-B1', B2-B2' and B3-B3' of FIGS. 5A, 6A, . . . through 16A.

Figure 5B:
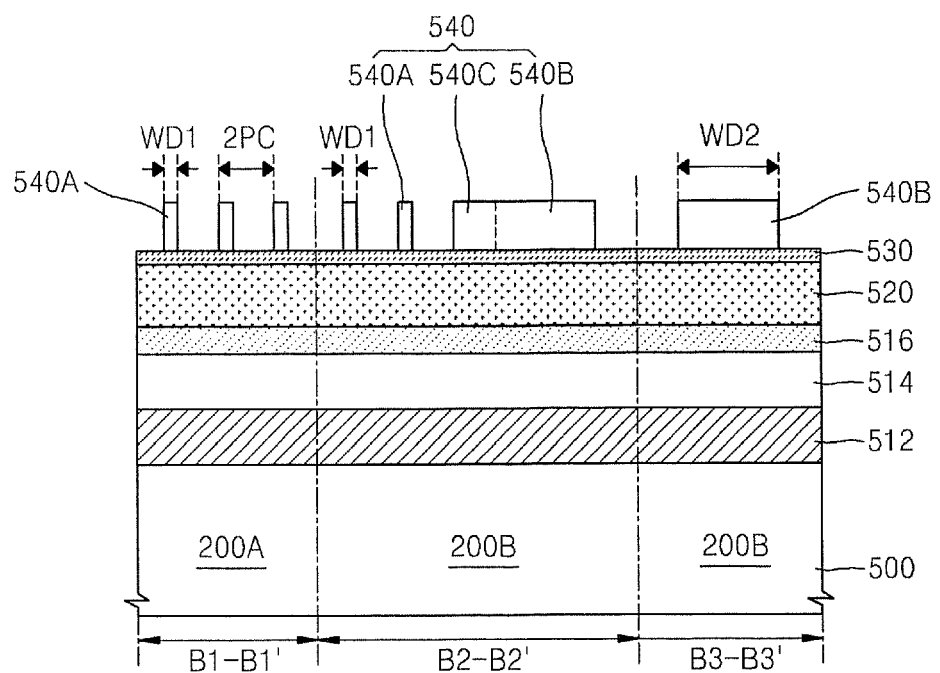
Figure 6A:
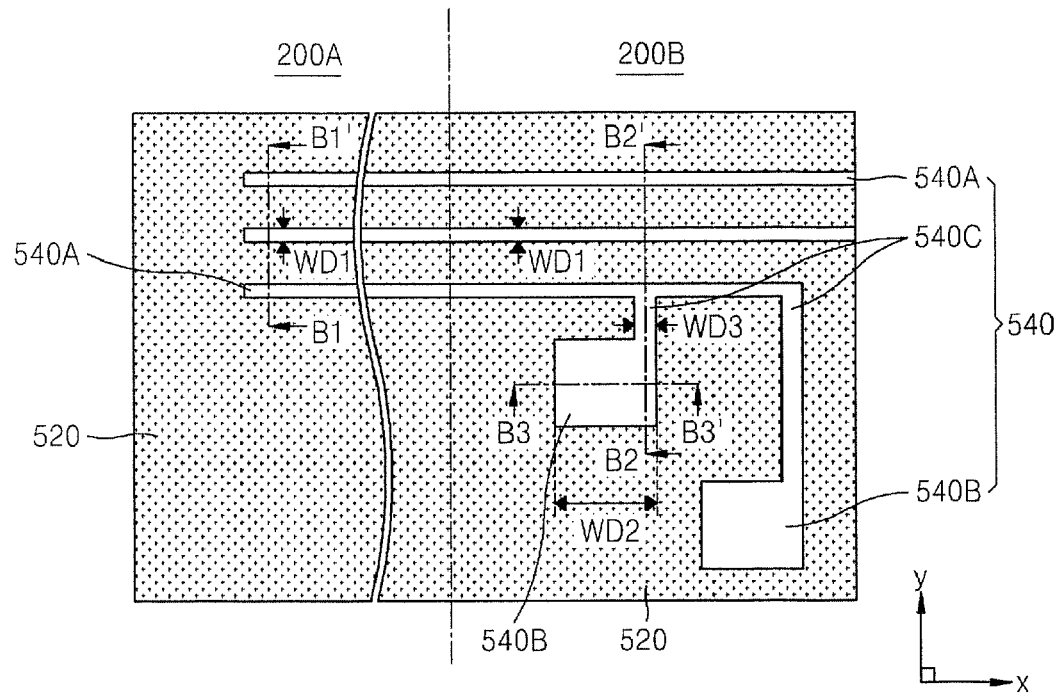

Referring to FIGS. 5A and 5B, a substrate 500 including the memory cell region 200A and the connection region 200B of FIG. 2 is prepared.

In the memory cell region 200A and the connection region 200B, a conductive layer 512 is formed on the substrate 500 which is used to form the plurality of conductive lines, e.g., conductive lines 201, 202, . . . , through 232, and a hard mask layer 514 and a buffer mask layer 516 are sequentially formed on the conductive layer 512. Then, a dual mask layer 520 and a variable mask layer 530 are sequentially formed on the buffer mask layer 516, and a plurality of mask patterns 540 are formed on the variable mask layer 530.

Each of the mask patterns 540 includes a first mask portion 540A, a second mask portion 540B, and a third mask portion 540C that connects the first and second mask portions 540A and 540B. The first mask portions 540A extend from the memory cell region 200A and into the connection region 200B, wherein the pitch of the stripes (i.e., the center-to-center distance between adjacent stripes) is a first pitch 2PC. The second mask portion 540B and the third mask portion 540C are formed in the connection region 200B.

In the memory cell region 200A and the connection region 200B, the first mask portions 540A may have the first pitch 2PC that is double a fine pitch PC of a pattern that is to be obtained. Also, in the memory cell region 200A and the connection region 200B, a fine width WD1 of each of the first mask portions 540A formed in a narrow pattern may be equal to a distance D1 between, for example, the conductive lines 201, 202, . . . , through 232 of FIG. 2, which is a pattern to be finally formed on the substrate 500.

The second mask portion 540B is formed to have a width less than the width of the pattern that is to be finally formed. For example, in order to form the contact pad 252 of FIG. 2, the second mask portion 540B is formed to have a width WD2 which is less than the width W2 of the contact pad 252 (see FIG. 2), as illustrated in a cross-sectional view taken along the line B3-B3' of FIG. 5B. The greater the difference between the width WD2 of the second mask portion 540B and the width WD1 of the first mask portion 540A, the greater the effect caused by the difference between the amounts of etching according to a three-dimensional (3D) etching effect used in a method according to embodiments of the present invention that will be described later with reference to FIGS. 7A and 7B. The first mask portion 540A and the second mask portion 540B may be simultaneously formed by performing a photolithography process once using a single photo mask.

The substrate 500 may be a general semiconductor substrate, such as, for example, a silicon substrate.

The conductive layer 512 may be doped polysilicon, metal, a metal nitride, or a combination thereof. For example, when word lines are formed using the conductive layer 512, the conductive layer 512 may contain a material selected from the group consisting of TaN, TiN, W, WN, HfN and a tungsten silicide, or a conductive material of a combination thereof. When bit lines are formed using the conductive layer 512, the conductive layer 512 may be, for example, doped polysilicon or metal.

The hard mask layer 514 may be a single layer or have a multi-layer structure in which a plurality of hard mask layers having different etching characteristics are stacked under predetermined etching conditions. The hard mask layer 514 may be, for example, an oxide layer, a nitride layer, or a combination thereof. For example, the hard mask layer 514 may be an oxide layer and the buffer mask layer 516 may be a polysilicon layer or a nitride layer, but the present invention is not limited thereto. The hard mask layer 514 and the buffer mask layer 516 may be formed, respectively, of materials having different etching characteristics under predetermined etching conditions. In some cases, the buffer mask layer 516 may be omitted. The hard mask layer 514 may be formed to a thickness of about 1000 to about 3000 Angstroms. The buffer mask layer 516 may be formed to a thickness of about 300 to about 1000 Angstroms.

In the dual mask layer 520, a first portion on which the first mask portion 540A is formed may be used as a sacrificial layer for increasing the pattern density of the first mask portion 540A, and a part of an etch mask may be formed on a second portion on which the second mask portion 540B is formed in order to obtain a desired pattern.

The dual mask layer 520 may be formed of various types of materials according to the type of the buffer mask layer 516. For example, the dual mask layer 520 may be an amorphous carbon layer (ACL) or a carbon-containing layer. In other embodiments, the dual mask layer 520 may be formed of a silicon-containing material selected from the group consisting of $SiO_2$, $Si_3N_4$, SiCN, and polysilicon.

The dual mask layer 520 may be formed using a spin coating process or a chemical vapor deposition (CVD) process. For example, a process of forming the dual mask layer 520 when a carbon-containing material is used to form the dual mask layer 520 will be described. First, an organic compound is applied to a thickness of about 1000 to about 5000 Angstroms on the buffer mask layer 516 using a spin coating process, a CVD process, or another process. The organic compound may be formed of a hydrocarbon compound containing an aromatic ring, such as phenyl, benzene, and naphthalene, or a derivative thereof. The organic compound may be formed of a material having a relatively high carbon content of about 85 to about 99% by weight of the total weight of the organic compound. A carbon-containing layer may be obtained by baking the organic compound at a temperature of about 150 to about 350° C. in a first baking process. The first baking process may be performed for about sixty seconds. Then, the carbon-containing layer is hardened in a second baking process at a temperature of about 300 to about 550° C. The second baking process may be performed for about 30 to about 300 seconds. The carbon-containing layer is hardened through the second baking process in order to prevent the carbon-containing layer from deteriorating when another layer is formed thereon at a relatively high temperature, e.g., about 400° C. or more.

The variable mask layer 530 is formed to function as an etch mask with respect to the dual mask layer 520. The thickness of the variable mask layer 530 may be selected to cause the 3D etching effect (which will be described later with reference to FIGS. 7A and 7B) based on the material of the variable mask layer 530, etch conditions of a subsequent process of etching the dual mask layer 520 (which will also be described later with reference to FIGS. 7A and 7B), the width WD1 of the first mask portion 540A, and the width WD2 of the second mask portion 540B.

The variable mask layer 530 may be formed of a material having an etch selectivity with respect to the dual mask layer 520 so that it may be used as an etch mask for the dual mask layer 520. For example, the variable mask layer 530 may be formed of a silicon-containing material selected from the group consisting of SiON, $SiO_2$, $Si_3N_4$, SiCN, and polysilicon. In other embodiments, the variable mask layer 530 may be formed of a metal or of an organic material.

The mask pattern 540 may be formed, for example, using a photolithography process. The mask pattern 540 may be a photoresist layer, or may have a stacked structure of an anti-reflecting layer formed of an organic or inorganic material and a photoresist layer.

In the mask pattern 540, the width WD1 of the first mask portion 540A corresponds to the minimum feature size of a semiconductor device that is to be obtained, and the width WD2 of the second mask portion 540B may be greater than the minimum feature size. For example, the width WD1 of the first mask portion 540A may range from several nm to several tens of nm.

As illustrated in FIG. 5A, the width WD3 of the third mask portion 540C between the first mask portion 540A and the second mask portion 540B may be greater than the width WD1 of the first mask portion 540A.

Figure 6B:
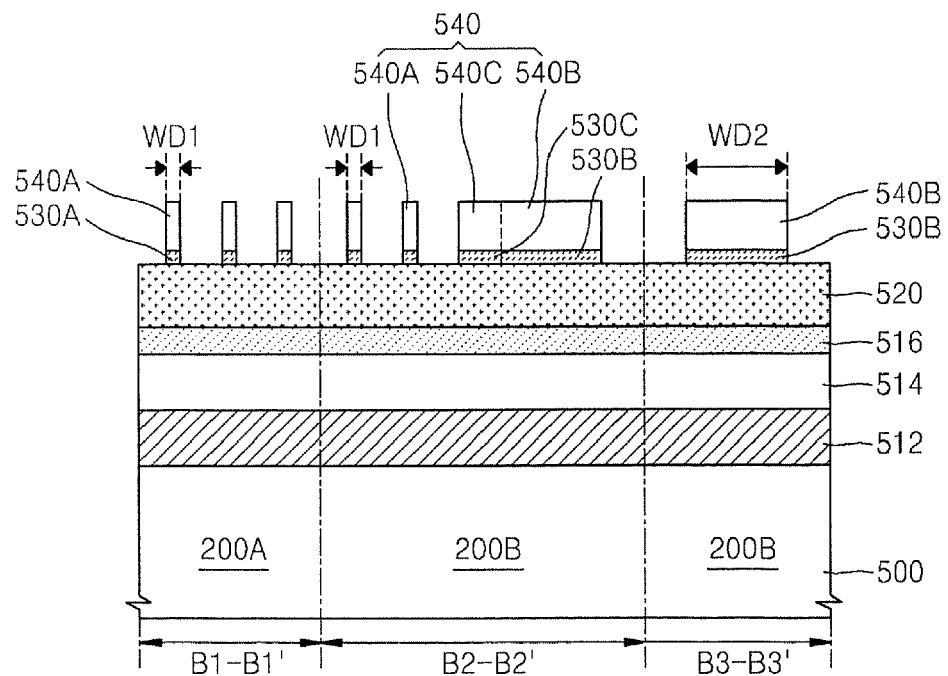

Referring to FIGS. 6A and 6B, the variable mask layer 530 is etched using the mask pattern 540 as an etch mask in order to form first to third variable mask patterns 530A, 530B, and 530C in the memory cell region 200A and the connection region 200B. The first variable mask pattern 530A is located below the first mask portion 540A, the second variable mask pattern 530B is located below the second mask portion 540B, and the third variable mask pattern 530C is located below the third mask portion 540C.

The width of the mask pattern 540 is transcribed onto the variable mask layer 530, and thus, the first variable mask pattern 530A may have a width equal to the width WD1 of the first mask portion 540A and the second variable mask pattern 530B may have a width equal to the width WD2 of the second mask portion 540B, and the third variable mask pattern 530C may have a width equal to the width WD3 of the third mask portion 540C.

The thickness (i.e., the height in the figures) of the mask pattern 540 may decease when the variable mask layer 530 is etched to form the first variable mask pattern 530A, the second variable mask pattern 530B, and the third variable mask pattern 530C.

Figure 7A:
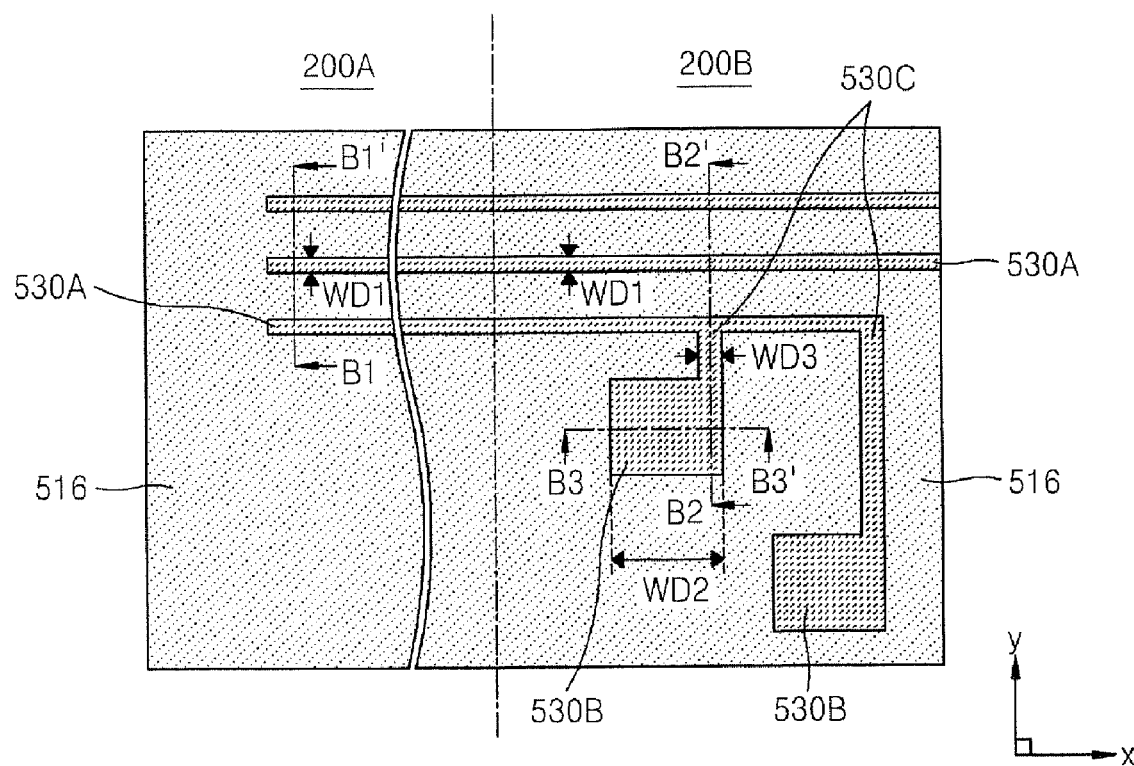
Figure 7B:
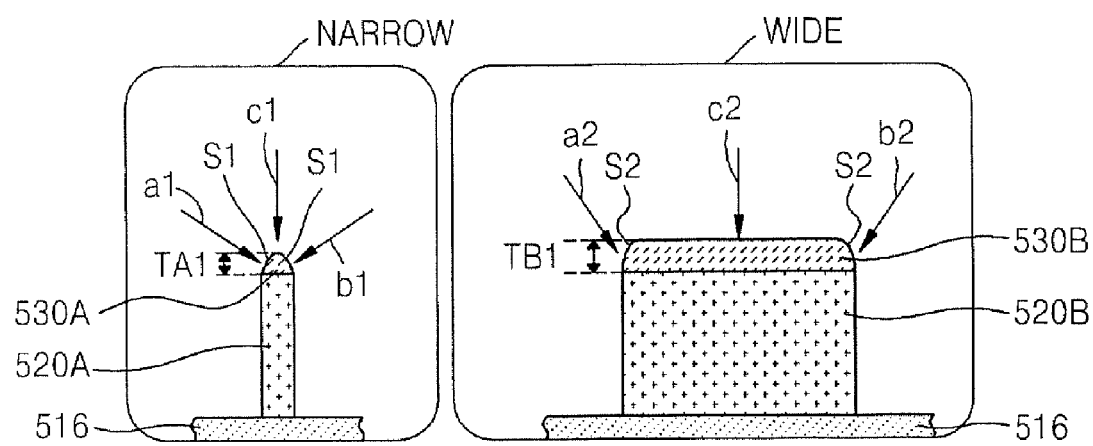
Figure 7B:
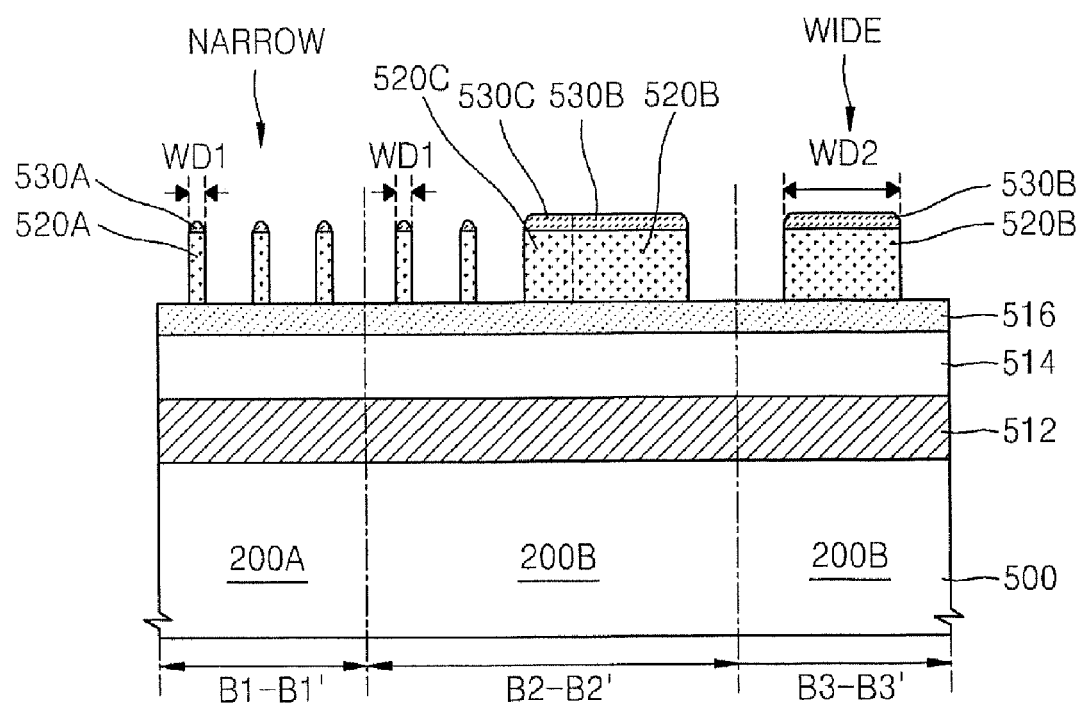

Referring to FIGS. 7A and 7B, after the mask pattern 540 is removed, the first, second and third mask patterns 520A, 520B, and 520C that are disposed below the first, second and third variable mask patterns 530A, 530B, and 530C, respectively, are formed by etching the dual mask layer 520 by using the first, second and third variable mask patterns 530A, 530B, and 530C as etch masks until the buffer mask layer 516 is exposed.

During the etching of the dual mask layer 520, the first variable mask pattern 530A and the second variable mask pattern 530B are influenced under an etch atmosphere in various directions including perpendicular and parallel directions with respect to the direction in which a main surface of the substrate 500 extends, as indicated in blocks NARROW and WIDE of FIG. 7B with arrows a1, b1, c1, a2, b2, and c2. As a result, the sidewalls of the first variable mask pattern 530A have inclined etch surfaces S1, and the sidewalls of the second variable mask pattern 530B have inclined etch surfaces S2 as illustrated in FIG. 7B. In this case, the fine width WD1 of the first variable mask pattern 530A is less than the width WD2 of the second variable mask pattern 530B. Thus, as the inclined etch surface S1 becomes continuously abraded in the directions indicated by the arrows a1 and b1 or in other directions, the inclined surfaces S1 of the sidewalls of the first variable mask pattern 530A meet each other at a top surface of the first variable mask pattern 530A within a short period of time. Accordingly, abrasion of the top surface of the first variable mask pattern 530A is accelerated in the direction indicated by the arrow c1 as the amount of abrasion of the sidewalls of the first variable mask pattern 530A increases (hereinafter, referred to as "the 3D etch effect"). However, since the width WD2 of the second variable mask pattern 530B is greater than the width WD1 of the first variable mask pattern 530A, the amount of abrasion of the top surface of the second variable mask pattern 530B in the direction indicated with the arrow c2 until etching of the dual mask layer 530 is completed, is far less than the amount of abrasion of the first variable mask pattern 530A in the direction indicated with the arrow c1 because of the 3D etch effect, even when the inclined etch surface S2 is continuously abraded in the directions indicated with the arrows a2 and b2 and other directions.

Thus, after the first mask pattern 520A and the second mask pattern 520B are formed, the thickness TA1 of the first variable mask pattern 530A that remains on the first mask pattern 520A is less than the thickness TB1 of the second variable mask pattern 530B that remains on the second mask pattern 520B. The greater the difference between the width WD2 and the width WD1, the greater the difference between the thickness TA1 of the first variable mask pattern 530A and the thickness TB1 of the second variable mask pattern 530B.

In the method illustrated in FIGS. 7A and 7B, a dry etch process may be used to etch the dual mask layer 520. For example, when the dual mask layer 520 is a carbon-containing layer described above with reference to FIGS. 5A and 5B, a plasma etch process using a mixture of an $O_2$ gas and an argon (Ar) gas may be performed to etch the dual mask layer 520.

Figure 8A:
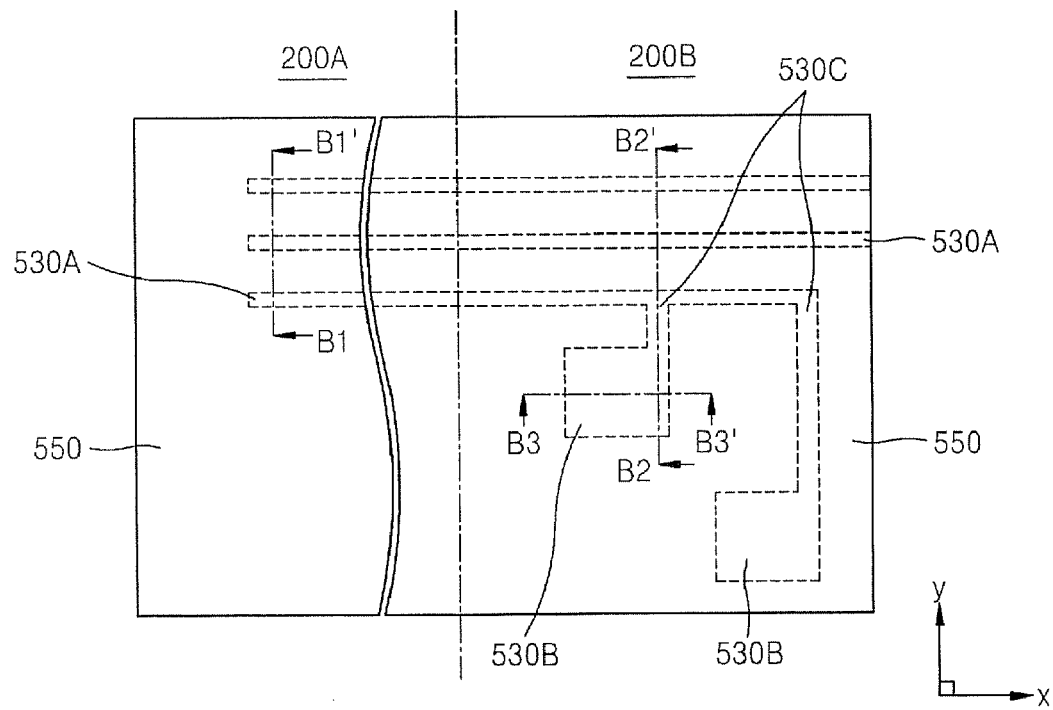
Figure 8B:
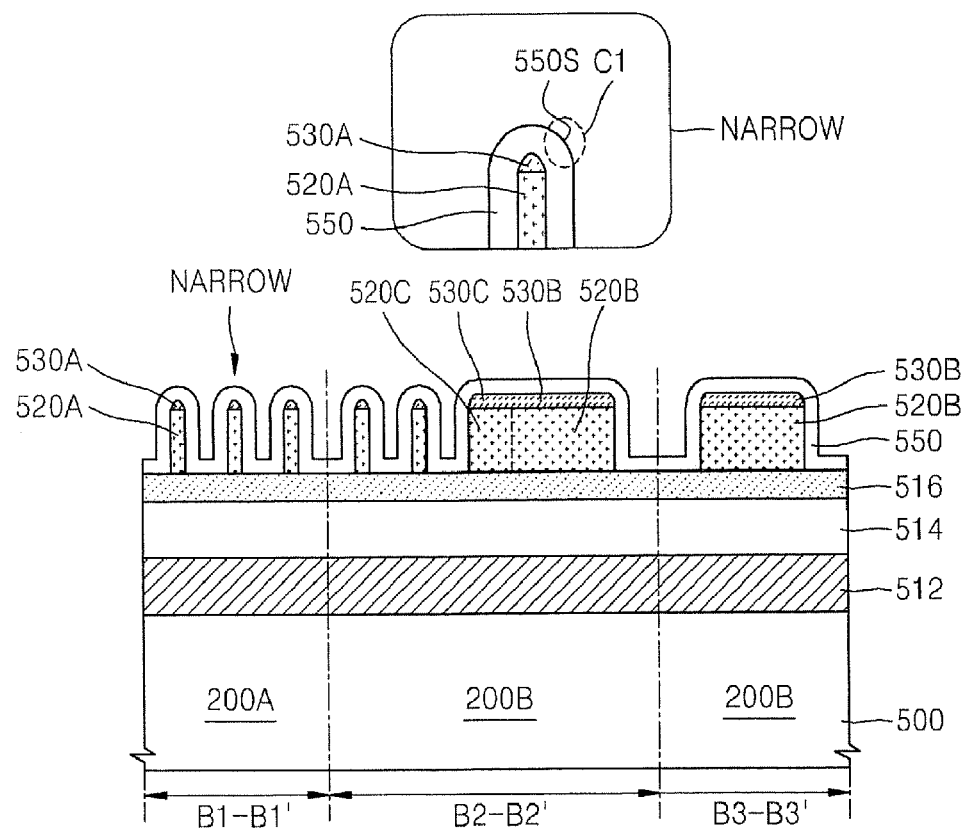

Referring to FIGS. 8A and 8B, a spacer mask layer 550 is formed to evenly cover the entire exposed surface of the resultant structure. An upper surface of the spacer mask layer 550 on one of the inclined etch surfaces S1 of the first variable mask pattern 530A, which is indicated with a dotted circle C1, has an inclined surface 550S corresponding to the degree of inclination of the inclined etch surface S1. The inclined surface 550S of the spacer mask layer 550 may be useful for performing an etch process in order to form a plurality of first spacers 550A which will be described later with reference to FIGS. 9A and 9B.

The spacer mask layer 550 may be formed of a material having etch selectivity with respect to the first, second and third variable mask patterns 530A, 530B, and 530C and the buffer mask layer 516. For example, the spacer mask layer 550 may be an oxide layer. An atomic layer deposition (ALD) process may be used to evenly form the spacer mask layer 550 on the substrate 500.

Figure 9A:
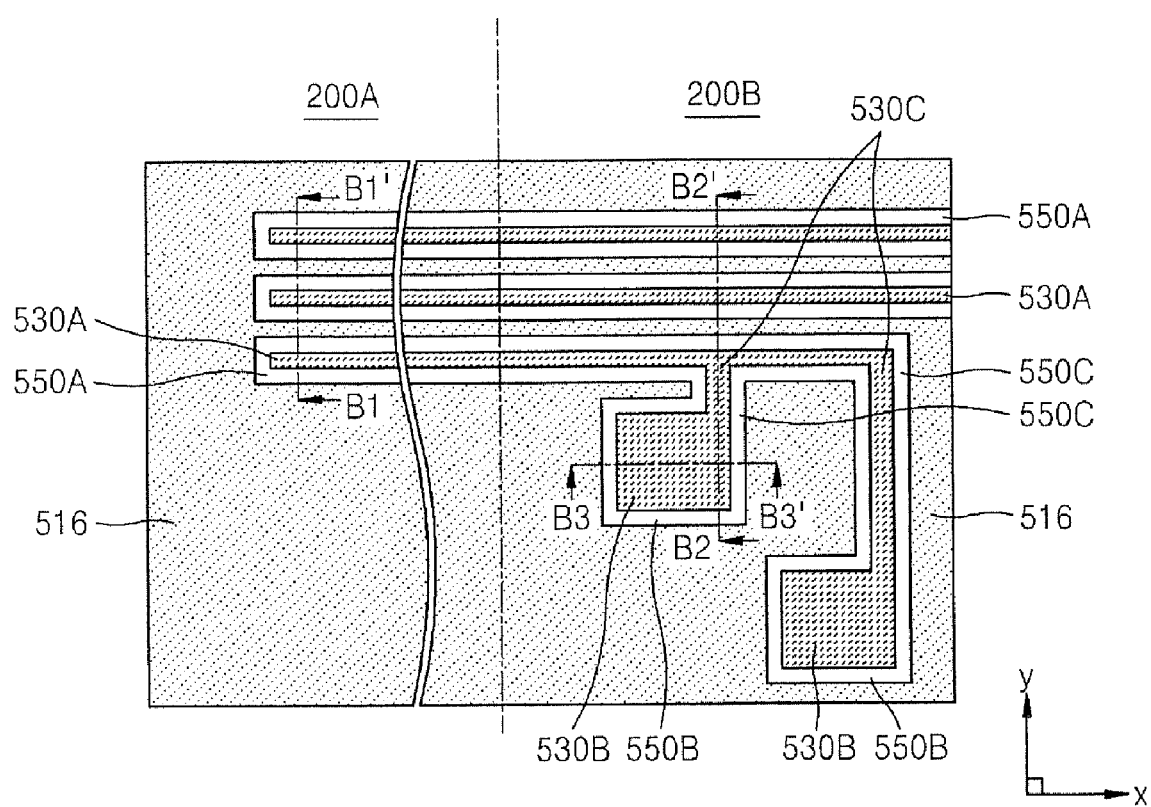
Figure 9B:
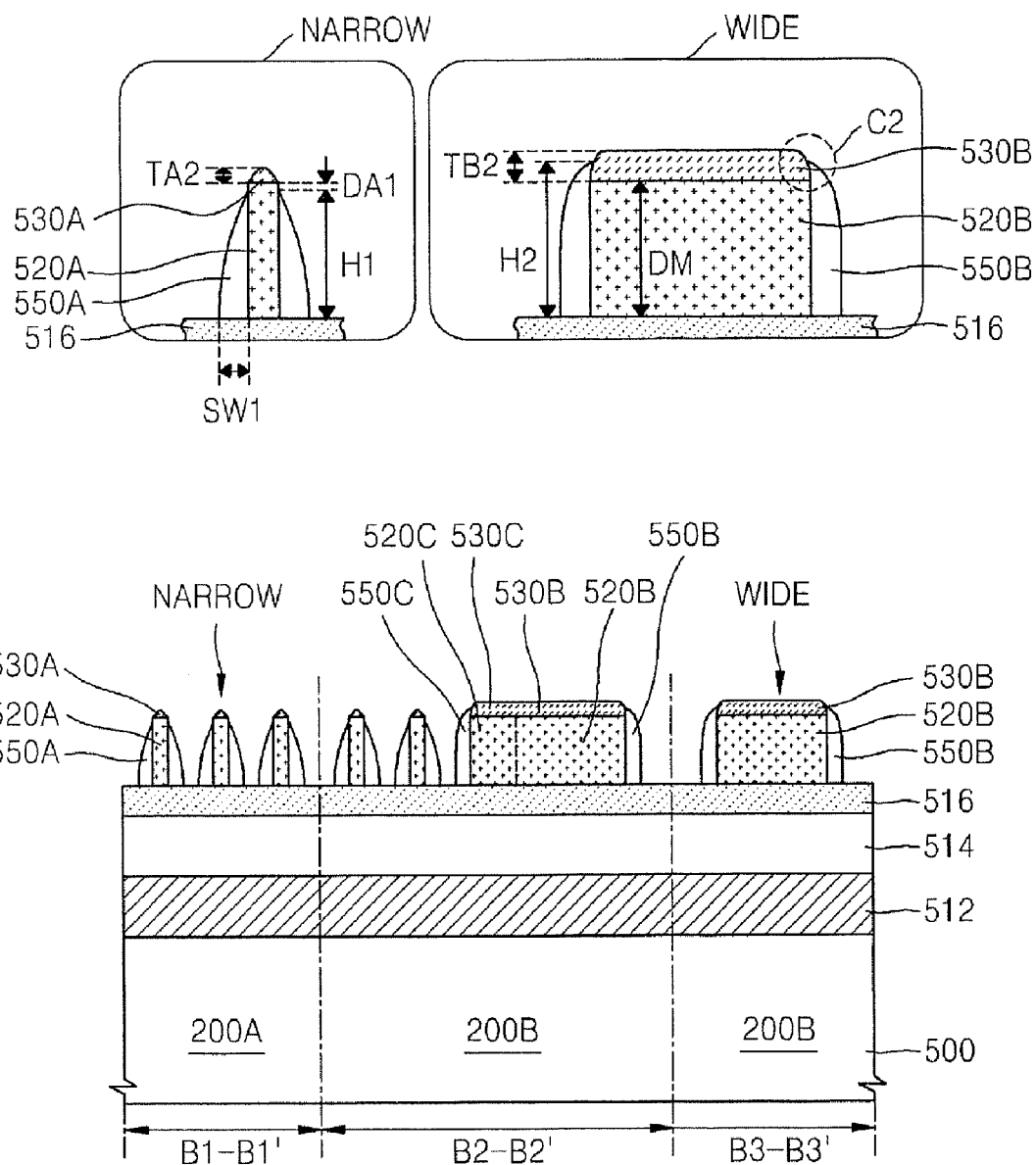

Referring to FIGS. 9A and 9B, a plurality of first to third spacers 550A, 550B, and 550C are formed by etching the spacer mask layer 550 until a top surface of the buffer mask layer 516 is exposed. The first spacer 550A covers the sidewalls of the first mask pattern 520A, the second spacer 550B covers the sidewalls of the second mask pattern 520B, and the third spacer 550C covers the sidewalls of the third mask pattern 520C.

The first spacer 550A may function as an etch mask in order to increase the pattern density in the memory cell region 200A, and the second spacer 550B may function as a part of an etch mask used to form a wide pattern in the connection region 200B, where the width of the wide pattern is greater than the width of the pattern in the memory cell region 200A. In the memory cell region 200A, the width SW1 of the first spacer 550A may be equal to the width W1 of the conductive lines 201, 202, . . . , through 232 of FIG. 2.

During the etching of the spacer mask layer 550, etching of the spacer mask layer 550 is accelerated on the first mask pattern 520A due to the inclined surface 550S of the spacer mask layer 550, and therefore the etch rate of the spacer mask layer 550 on the first mask pattern 520A may be greater than the etch rate of the spacer mask layer 550 on the second mask pattern 520B. Thus, during the formation of the first, second and third spacers 550A, 550B, and 550C, the thickness TA2 of the first variable mask pattern 530A remaining on the first mask pattern 520A is reduced more than the thickness TB2 of the second variable mask pattern 530B that remains on the second mask pattern 520B is reduced. Thus, the difference between the thickness TB2 of the second variable mask pattern 530B and the thickness TA2 of the first variable mask pattern 530A may increase during the etching of the spacer mask layer 550. The height H1 of the first spacer 550A may be less than the height H2 of the second spacer 550B. Thus, the first variable mask pattern 530A and the first spacer 550A are separated from each other by a distance DA1, and the first mask pattern 520A may be exposed between the first variable mask pattern 530A and the first spacer 550A due to this separation.

On the second mask pattern 520B, the etch rate of the spacer mask layer 550 near the sidewall of the second variable mask pattern 530A is less than that of the inclined surface 550S of the spacer mask layer 550 on the first mask pattern 520A. As a result, the height H2 of the second spacer 550B from the top surface of the buffer mask layer 516 is greater than the distance DM between the top surface of the buffer mask layer 516 and the bottom surface of the second variable mask pattern 530B, and thus, a portion of the second spacer 550B may contact the second variable mask pattern 530B as indicated with a dotted circle C2 in FIG. 9B. Accordingly, the second mask pattern 520B may not be exposed since it may be entirely covered with the second spacer 550B and the second variable mask pattern 530B.

In the process of FIGS. 9A and 9B, the spacer mask layer 550 may be etched, for example, using a CxFy gas or a CHxFy gas as a main etch gas (x and y are integers in the range of 1 to 10). In some embodiments, a mixture of the main etch gas and at least one gas selected from an $O_2$ gas and an Ar gas, may be used. For example, the CxFy gas may be a $C_3F_6$, $C_4F_6$, $C_4F_8$, or $C_5F_8$ gas, and the CHxFy gas may be a $CHF_3$ or $CH_2F_2$ gas. Here, the $O_2$ gas added to the etch gas not only removes a polymer by-product produced in the etch process but also dissolves the CxFy etch gas. The Ar gas which may also be added to the etch gas may be used as a carrier gas, and causes ion bombarding. The spacer mask layer 550 may be etched under a plasma atmosphere by generating plasma of an etch gas selected from the above etch gases in an etch chamber. In some cases, the spacer mask layer 550 may be etched under the above etch gas atmosphere having no ion energy by generating plasma in the etch chamber. For example, a mixture of the $C_4F_6$, $CHF_3$, $O_2$, and Ar gases may be used as an etch gas in order to etch the spacer mask layer 550. In this case, a plasma-based dry etch process may be performed under a pressure of about 30 mT for several seconds to several tens of seconds while supplying the $C_4F_6$, $CHF_3$, $O_2$, and Ar gases so that the cubic volumes of the $C_4F_6$, $CHF_3$, $O_2$, and Ar gases may be in the ratio of about 1:6:2:14.

In the process of FIGS. 9A and 9B, in order to etch the spacer mask layer 550 under etch conditions where the amount of polymer by-products produced is large, when an etch gas is selected from the $C_4F_6$, $CHF_3$, $O_2$, and Ar gases, the amount of polymer by-products produced may be increased by reducing the flow rate of the $O_2$ gas so that the content of the $O_2$ gas contained in the etch gas is reduced. Alternatively, the amount of polymer by-products produced may be increased by lowering the etch temperature, or by reducing the content of the $O_2$ gas in the etch gas and lowering the etch temperature. When the spacer mask layer 550 is etched under the etch conditions where the amount of polymer by-products produced is large as described above, for example, CxFy-based polymer by-products may be accumulated on a relatively wide pattern, such as the second variable mask pattern 530B, to obtain a polymer by-product layer (not shown).

Figure 10A:
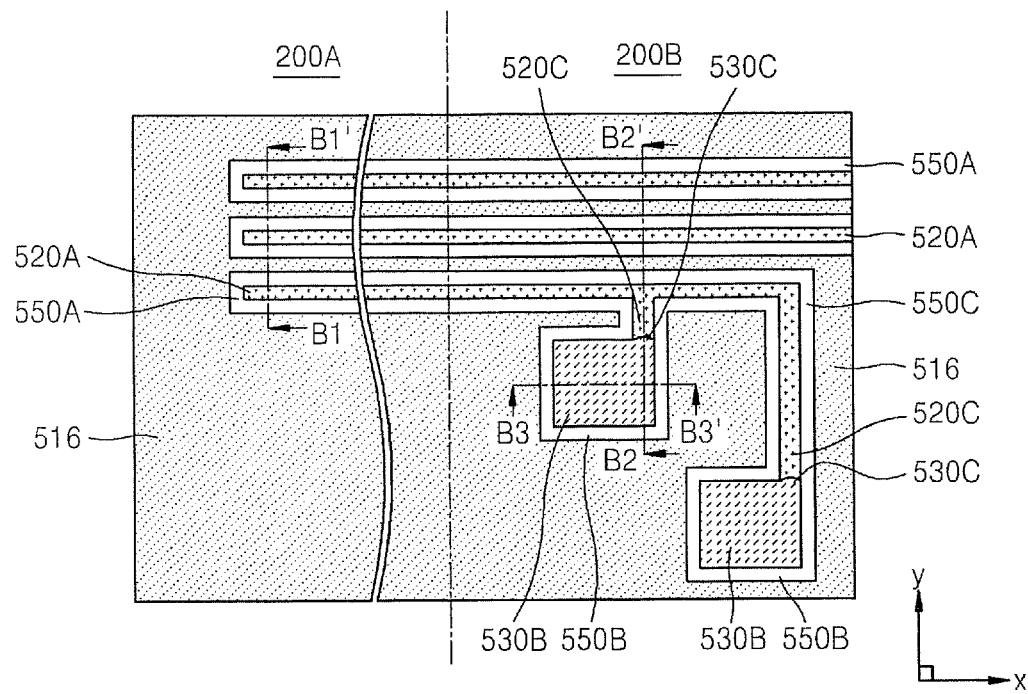
Figure 10B:
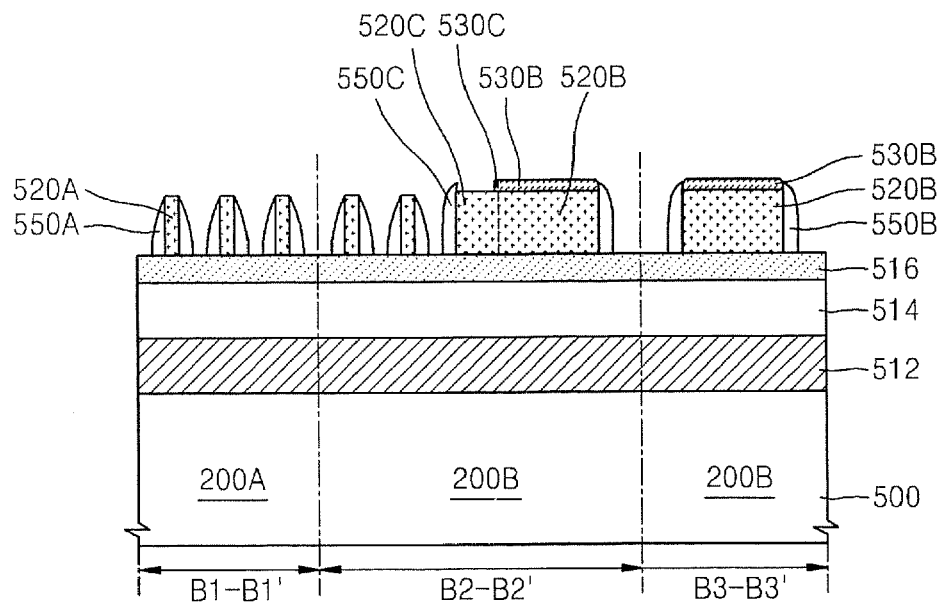

Referring to FIGS. 10A and 10B, the first variable mask pattern 530A is selectively removed in order to expose the top surface of the first mask pattern 520A.

Since the size and thickness of the first variable mask pattern 530A are less than those of the second variable mask pattern 530B, the etch rate of the first variable mask pattern 530A is greater than that of the second variable mask pattern 530B although the first variable mask pattern 530A and the second variable mask pattern 530B are formed of the same material. Thus, when the first variable mask pattern 530A is completely removed in the memory cell region 200A and the connection region 200B, the second variable mask pattern 530B in the connection region 200B may remain on the second mask pattern 520B.

However, when the width WD3 of the third variable mask pattern 530C on the third mask pattern 520C is not significantly different from the width WD1 of the first variable mask pattern 530A, an edge of the third variable mask pattern 530C may be abraded as illustrated in FIG. 10A. In particular, the amount of etching may be set to remove both the first variable mask pattern 530A and the third variable mask pattern 530C together. In this case, as illustrated in FIGS. 10A and 10B, a small part of the third variable mask pattern 530C may remain near the second variable mask pattern 530B. Otherwise, although not illustrated, when the first variable mask pattern 530A is removed, not only the third variable mask pattern 530C may be completely removed but also a portion of the second variable mask pattern 530B, which is adjacent to the third variable mask pattern 530C, may be removed, thereby causing a recessed portion in the second variable mask pattern 530B near the third spacer 550C.

After the first variable mask pattern 530A and the third variable mask pattern 530C are removed, the first mask pattern 520A and the third mask pattern 520C that are respectively disposed below them are exposed.

A dry or wet etch process may be used to remove the first variable mask pattern 530A. For example, when the first variable mask pattern 530A is formed of SiON or $Si_3N_4$, a CHxFy gas may be used as a main gas to remove the first variable mask pattern 530A (x and y are integers in the range of 1 to 10). Otherwise, a mixture of the CxFy gas and a CHxFy gas may be used as the main etch gas. Otherwise, a mixture of the main etch gas and at least one gas selected from an $O_2$ gas and an Ar gas, may be used. For example, in order to remove the first variable mask pattern 530A, a mixture of $CH_2F_2$, $CHF_3$, $O_2$, and Ar gases may be used as an etch gas. In this case, the plasma-based dry etch process may be performed under a pressure of about 40 mT for several seconds to several tens of seconds while these gases are supplied so that the cubic volumes of the $CH_2F_2$, $CHF_3$, $O_2$, and Ar gases are in the ratio of about 4:1:5:9.

The first variable mask pattern 530A may be removed immediately after performing the process of etching the spacer mask layer 550 for forming the first, second and third spacers 550A, 550B, and 550C as illustrated in FIGS. 9A and 9B. In some embodiments, the first variable mask pattern 530A may be removed in-situ in the same chamber and with the same etch conditions that are used to etch the spacer mask layer 550. In this case, it is also possible to obtain the effect described above with reference to FIGS. 10A and 10B.

Figure 11A:
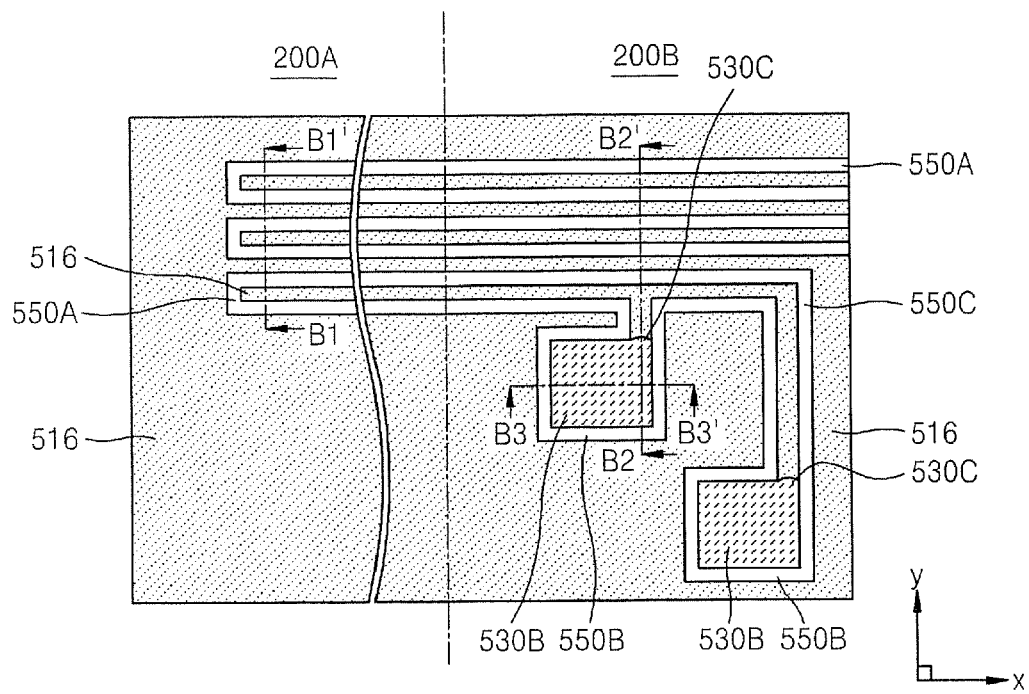
Figure 11B:
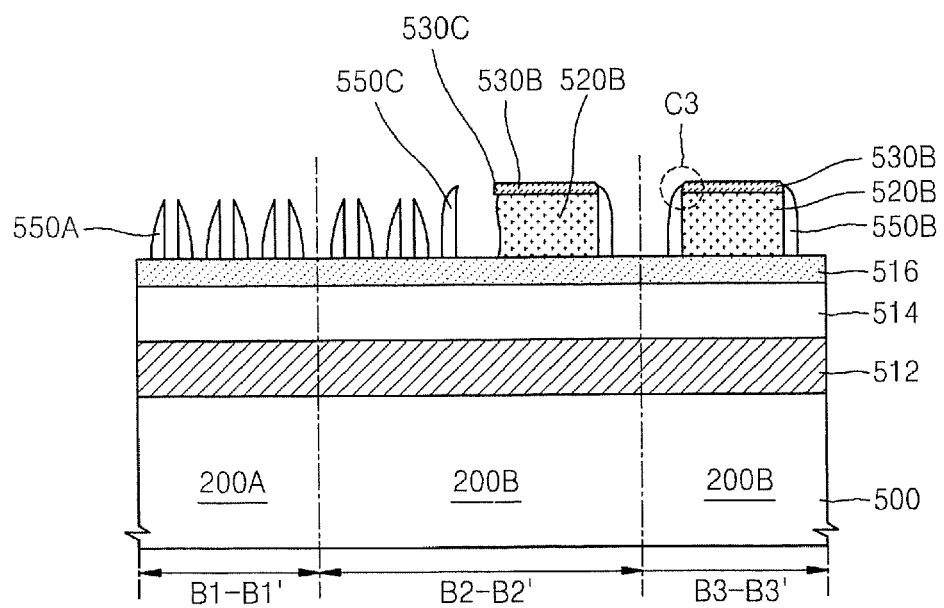

Referring to FIGS. 11A and 11B, the exposed first mask pattern 520A and third mask pattern 520C are removed from the memory cell region 200A and the connection region 200B in order to expose the buffer mask layer 516 via the space between adjacent first spacers 550A and the space between adjacent third spacers 550C. The first mask pattern 520A may be removed using an isotropical etch process.

Since the second spacer 550B and the second variable mask pattern 530B partially contact each other on the second mask pattern 520B as indicated with a dotted circle C3 in FIG. 11B, the second mask pattern 520B is not exposed since it is entirely covered by the second spacer 550B and the second variable mask pattern 530B. Thus, when the first mask pattern 520A is removed, the top surface and sidewalls of the second mask pattern 520B may be protected by the second variable mask pattern 530B and the second spacer 550B.

By removing the first mask pattern 520A and the third mask pattern 520C under isotropical etch conditions, only the second mask pattern 520B which is a relatively wide pattern may remain after the etch is completed.

The process of removing the first mask pattern 520A and the third mask pattern 520C may be performed under conditions where etching of the first, second and third spacers 550A, 550B, and 550C, the second and third variable mask patterns 530B and 530C, and the buffer mask layer 516 is controlled.

If the first mask pattern 520A and the third mask pattern 520C are formed of the carbon-containing layer described above with reference to FIGS. 5A and 5B, the first mask pattern 520A and the third mask pattern 520C may be removed, for example, using ashing and strip processes. In other embodiments, the first mask pattern 520A and the third mask pattern 520C may be removed using, for example, a dry or wet etch process.

Figure 12A:
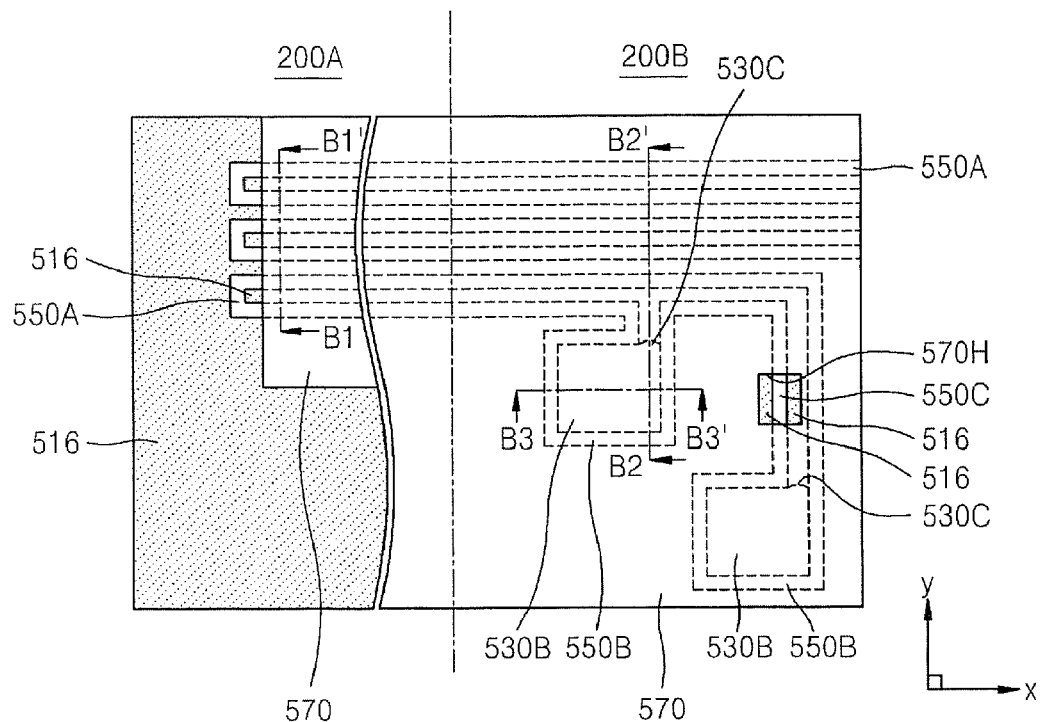
Figure 12B:
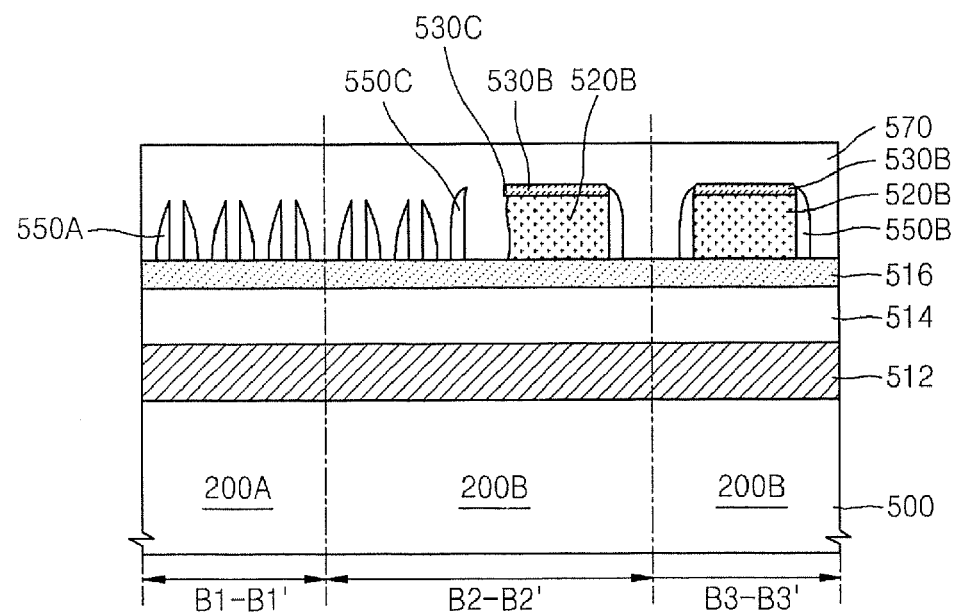

Referring to FIGS. 12A and 12B, a trimming mask pattern 570 is formed on the first, second and third spacers 550A, 550B, 550C in the memory cell region 200A and the connection region 200B. The trimming mask pattern 570 exposes a part of the first spacer 550A in the memory cell region 200A (see FIG. 12A). Also, the trimming mask pattern 570 has an aperture 570H through which a portion of the third spacer 550C is exposed in the connection region 200B (see FIG. 12A). The trimming mask pattern 570 may be a photoresist pattern.

Figure 13A:
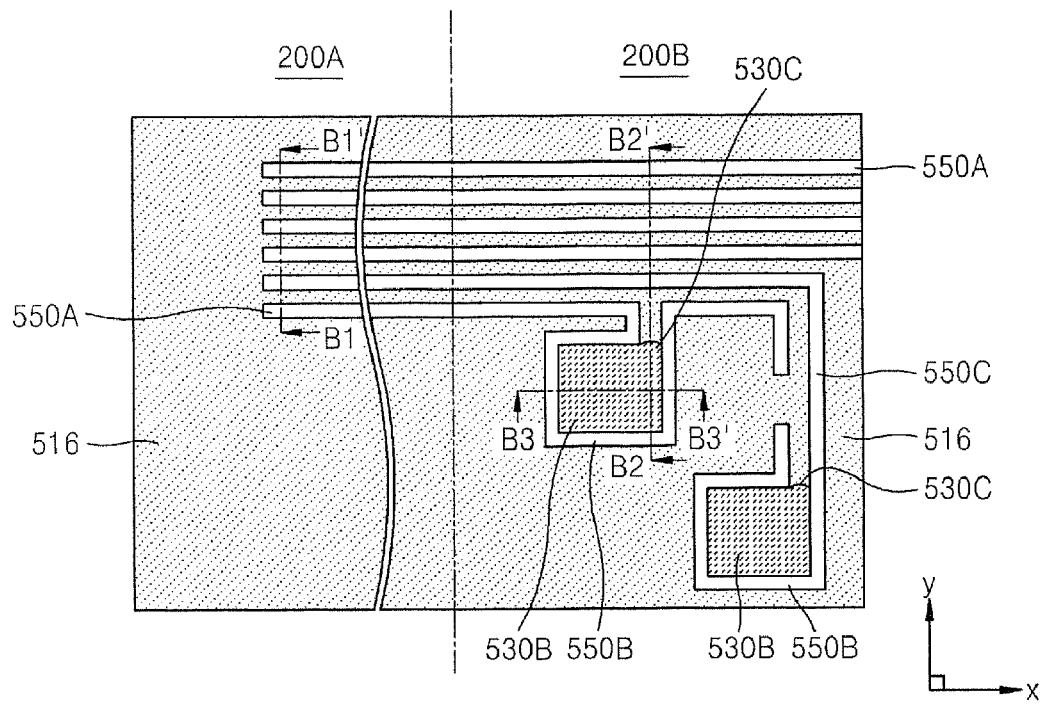
Figure 13B:
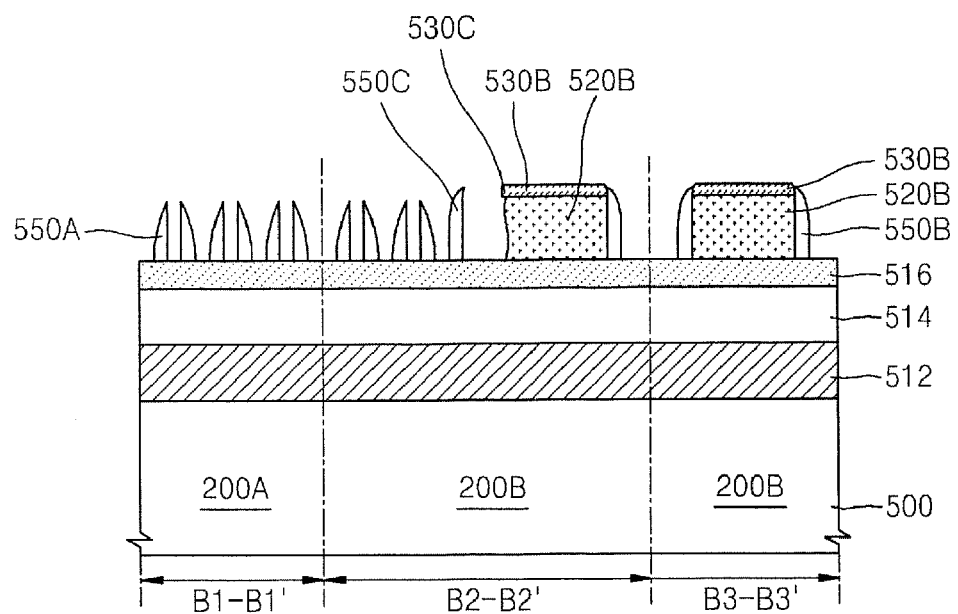

Referring to FIGS. 13A and 13B, a trimming process is performed to expose the portions of the first spacer 550A and the third spacer 550C in the memory cell region 200A and the connection region 200B, by using the trimming mask pattern 570 as an etch mask. As a result, each of the first, second and third spacers 550A, 550B, and 550C that are connected to one another in a loop form in the memory cell region 200A and the connection region 200B of the substrate 500 is divided into two parts.

Next, the trimming mask pattern 570 is removed.

Figure 14A:
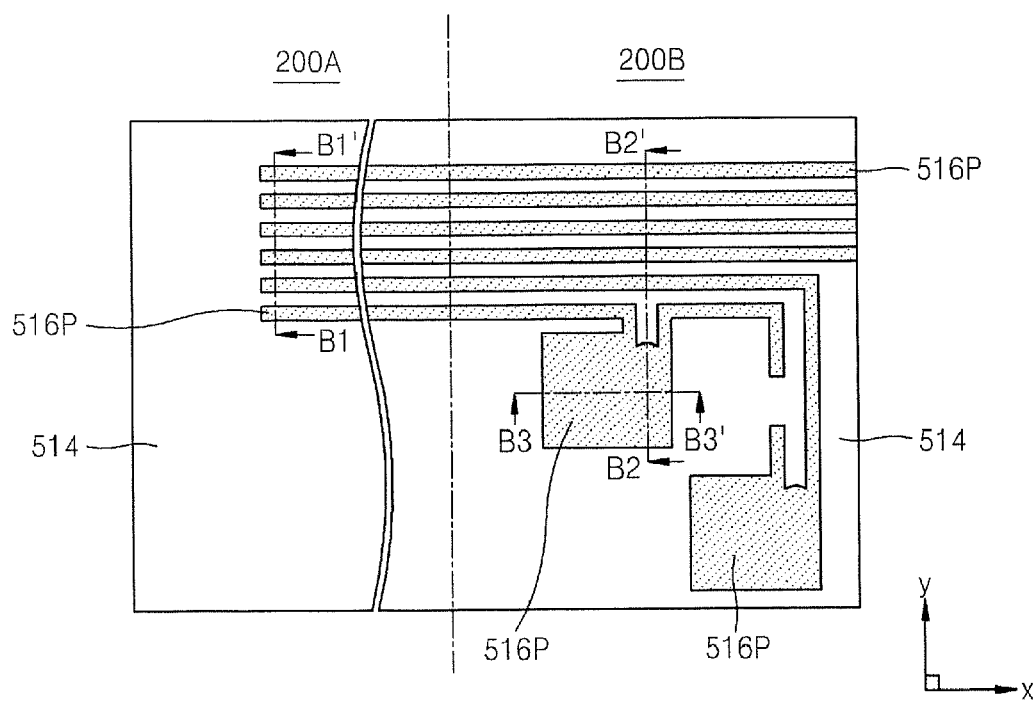
Figure 14B:
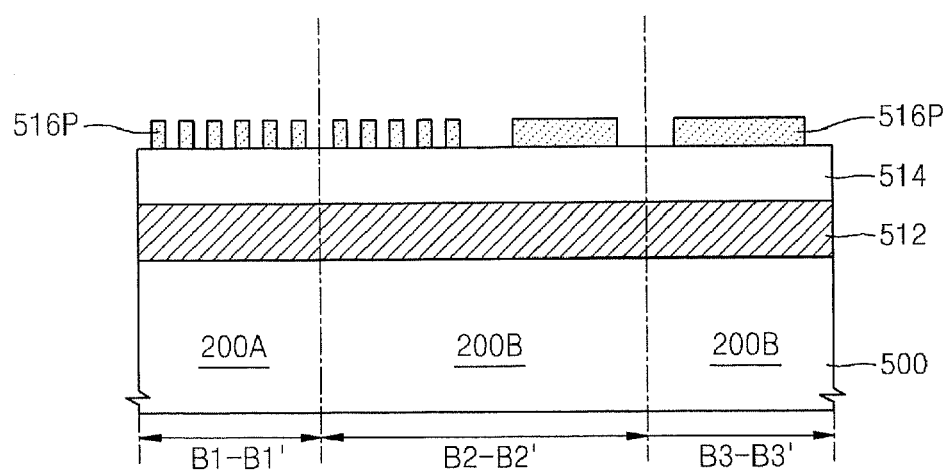

Referring to FIGS. 14A and 14B, a plurality of buffer mask patterns 516P are formed in the memory cell region 200A and the connection region 200B by etching the buffer mask layer 516 using the first, second and third spacers 550A, 550B, and 550C in the memory cell region 200A and the connection region 200B and the second variable mask pattern 530B and the third variable mask pattern 530C in the connection region 200B as etch masks. The hard mask layer 514 is exposed through the mask patterns 516P.

Although not illustrated in the drawings, after the buffer mask patterns 516P are formed, residual portions of the first, second and third spacers 550A, 550B, and 550C and a residual portion of the second variable mask pattern 530B may remain on the buffer mask patterns 516P.

Figure 15A:
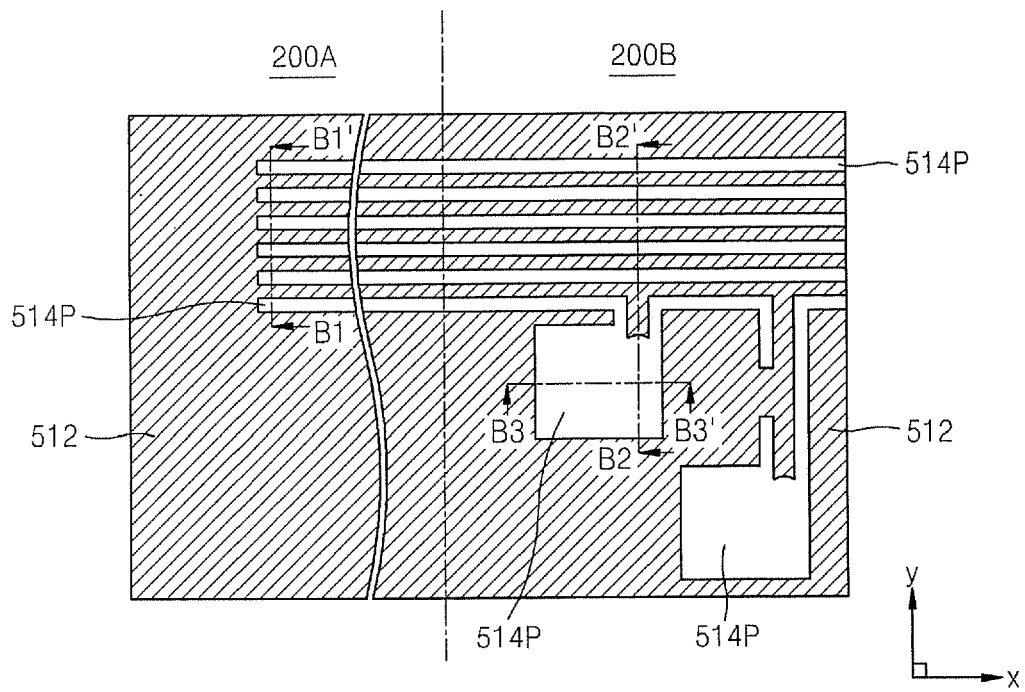
Figure 15B:
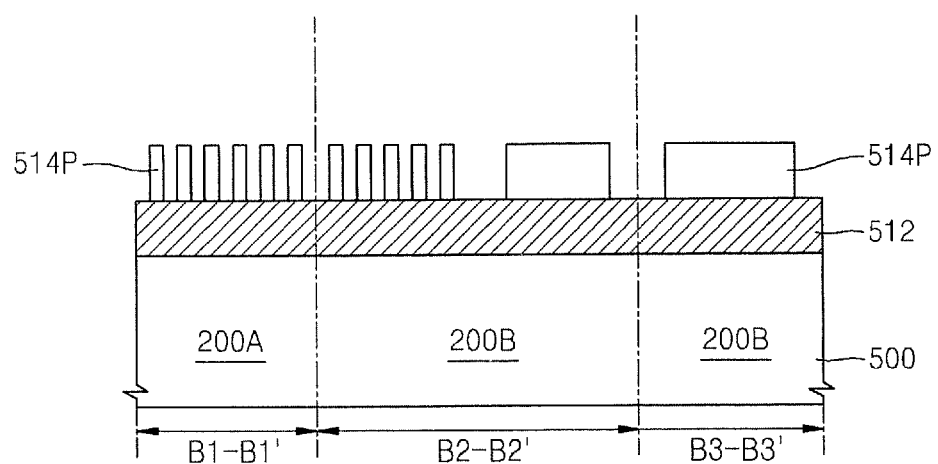

Referring to FIGS. 15A and 15B, a plurality of hard mask patterns 514P are formed in the memory cell region 200A and the connection region 200B by etching the hard mask layer 514 using the buffer mask patterns 516P as etch masks in the memory cell region 200A and the connection region 200B. The conductive layer 512 is exposed through the hard mask patterns 514P.

Although not illustrated in the drawings, after the hard mask patterns 514P are formed, residual portions of the buffer mask pattern 516P may remain on the hard mask patterns 514P.

Figure 16A:
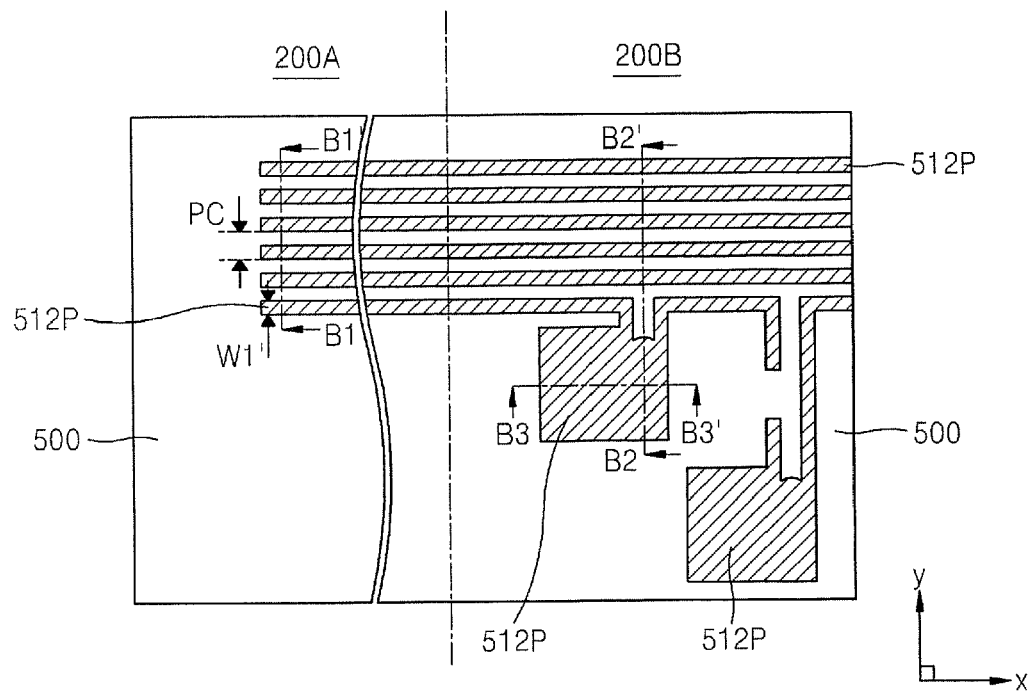
Figure 16B:
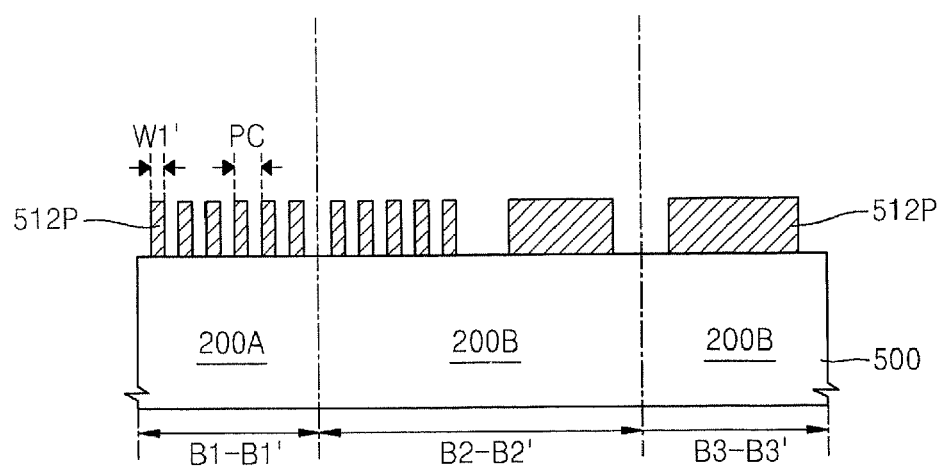

Referring to FIGS. 16A and 16B, the conductive layer 512 is etched using the hard mask patterns 514P as etch masks to form a plurality of conductive patterns 512P in the memory cell region 200A and the connection region 200B. The substrate 500 is exposed through the conductive patterns 512.

Although not illustrated in the drawings, after the conductive patterns 512P are formed, residual portions of the hard mask pattern 514P may remain on the conductive patterns 512P.

The conductive patterns 512P may be used to form the conductive lines 201, 202, . . . , through 232, the contact pads 252 and 254, and the dummy conductive lines 262 and 264 of the semiconductor device 200 illustrated in FIG. 2. In the memory cell region 200A, the conductive patterns 512P may have a width W1' which is one quarter of the first pitch 2PC described above with reference to FIGS. 5A and 5B. The conductive patterns 512P may have the fine pitch PC, which is half the first pitch 2PC.

In the method described with reference to FIGS. 5A through 16B, a double patterning process may be performed using the first spacers 550A formed along the sidewalls of the first mask pattern 520A as etch masks to form the conductive lines 201, 202, . . . , through 232 of FIG. 2 having fine widths and increased pattern density in locations where a narrow pattern is to be formed in the memory cell region 200A and the connection region 200B. Also, in the connection region 200B, the contact pads 252 and 254 of FIG. 2 are formed to be connected to the conductive lines 201, 202, . . . , through 232 and to have a relatively large width, simultaneously with the forming of the conductive lines 201, 202, . . . , through 232. The conductive lines 201, 202, . . . , through 232 and the contact pads 252 and 254, the widths of which are different from one another, are simultaneously formed according to the principle that the location where the conductive lines 201, 202, . . . , through 232 (narrow patterns) are formed is greatly influenced by the 3D etch effect due to the relatively small widths of the conductive lines 201, 202, . . . , through 232 but the location where the contact pads 252 and 254 (wide patterns) are formed is insignificantly influenced by the 3D etch effect due to the relatively large widths of the contact pads 252 and 254. Accordingly, a plurality of conductive patterns having different widths may be simultaneously formed on the substrate 500 without having to perform an additional photolithography process, thereby simplifying the manufacturing process and reducing the manufacturing costs.

Also, when the first mask pattern 520A is removed from the location where the conductive lines 201, 202, . . . , through 232 are formed by using the isotropical etch process, third mask patterns 520C between the conductive lines 201, 202, . . . , through 232 and the contact pads 252 and 254 are also removed together with the first mask patterns 520A through isotropical etching. Thus, the trimming process of separating adjacent conductive lines, for example, the conductive lines 201 and 202, and the process of forming the contact pads 252 and 254 may be easily performed.

In the method described with reference to FIGS. 5A through 16B, the conductive lines 201, 202, . . . , through 232 and the contact pads 252 and 254 are simultaneously formed on the substrate 500. Therefore, it is possible to form fine pitch conductive patterns in the memory cell region 200A, where the pitch of the conductive patterns is about half the pitch that can be obtained according to a general photolithography process. In particular, if the conductive lines 201, 202, . . . , through 232 are formed to have a width of 1F (the minimum feature size of semiconductor device) and the distances between the conductive lines 201, 202, . . . , through 232 are 1F, then it is possible to obtain a sufficient alignment margin when the trimming process is performed to separate adjacent conductive lines in the connection region 200B, i.e., when the photolithography process is performed to obtain the trimming mask pattern 570 as described above with reference to FIGS. 12A and 12B. Accordingly, it is possible to minimize the occurrence of problems caused by misalignment that is likely to occur when fine patterns are formed.

Figure 17:
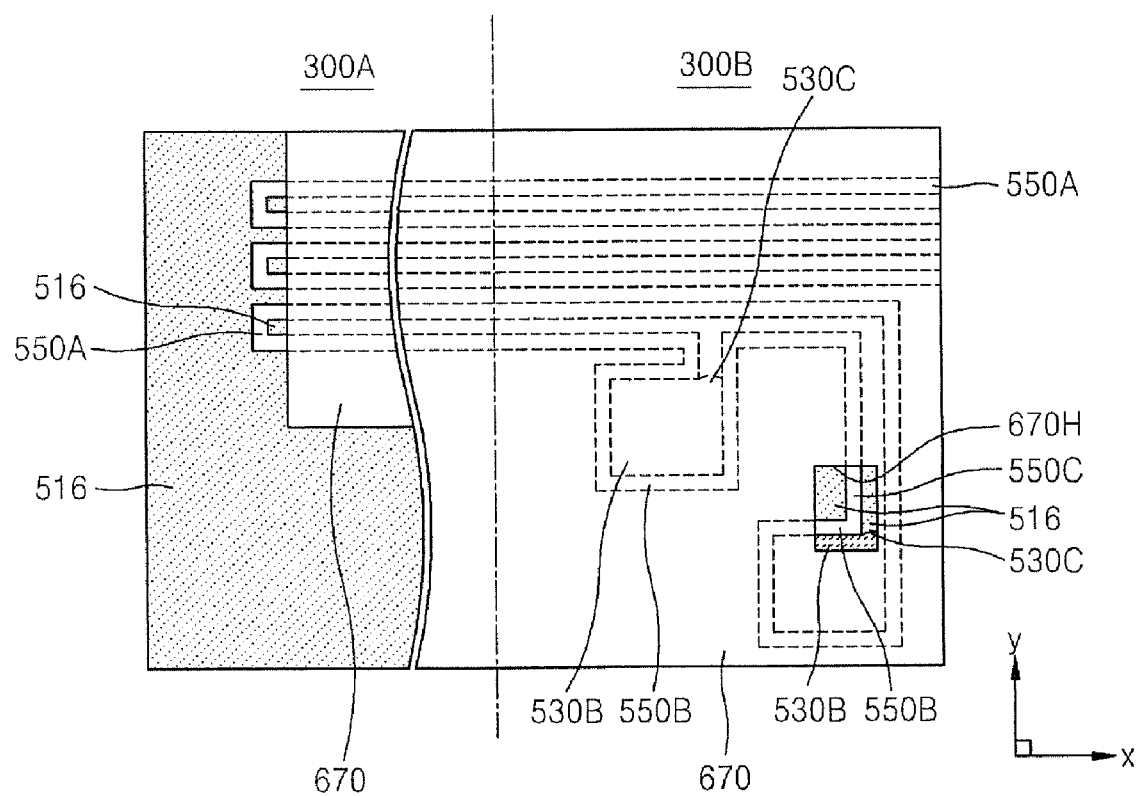
FIG. 17 is a plan view illustrating a method of forming patterns of a semiconductor device according to further embodiments of the present invention.

FIG. 17 is a plan view illustrating a method of forming patterns of a semiconductor device, e.g., the semiconductor device 300 of FIG. 3, according to further embodiments of the present invention.

In particular, FIG. 17 is a plan view of the region indicated with reference numeral 17 in FIG. 3. The method of FIG. 17 is similar to the method of FIGS. 5A through 16B except that a trimming mask pattern 670 has a different construction than the trimming mask pattern 570 described above with reference to FIG. 12A.

In FIG. 17, reference numerals that are the same as those of FIGS. 5A through 16B denote the same elements, and thus, detailed descriptions thereof are not repeated here.

According to the method of FIG. 17, the processes described above with reference to FIGS. 5A through 11B are performed, and the trimming mask pattern 670 is formed using the same process as described above with reference to FIGS. 12A and 12B.

The trimming mask pattern 670 exposes a portion of the first spacer 550A in a memory cell region 300A, similar to the trimming mask pattern 570. However, in a connection region 300B, the trimming mask pattern 670 has an aperture 670H through which a portion of the third spacer 550C is exposed at a location that is different than in the trimming mask pattern 570. A second variable mask pattern 530B and a second spacer 550B may be partially exposed via the aperture 670H.

The conductive lines 201, 202, . . . , through 232, the contact pads 252 and 254, and the dummy conductive lines 262 and 264 of the semiconductor device 300 of FIG. 3, may be formed by performing the processes described above with reference to FIGS. 13A through 16B by using the trimming mask pattern 670 as an etch mask.

FIGS. 18 through 22 are plan views illustrating a method of forming patterns of a semiconductor device, e.g., the semiconductor device 400 of FIG. 4, according to further embodiments of the present invention.

In particular, FIGS. 18 through 22 are plan views of the region indicated with reference numeral 18 in FIG. 4. The method of FIGS. 18 through 22 is similar to the method of FIGS. 5A through 16B except that a mask pattern 740 has a different structure than that of the mask pattern 540 described above with reference to FIG. 5A and a trimming mask pattern 770 has a different structure than that of the trimming mask pattern 570 described above with reference to FIG. 12A, as will be described below in detail. In FIGS. 18 through 22, reference numerals that are the same as those of FIGS. 5A through 16B denote the same elements, and thus, detailed descriptions thereof will not be repeated here.

Figure 18:
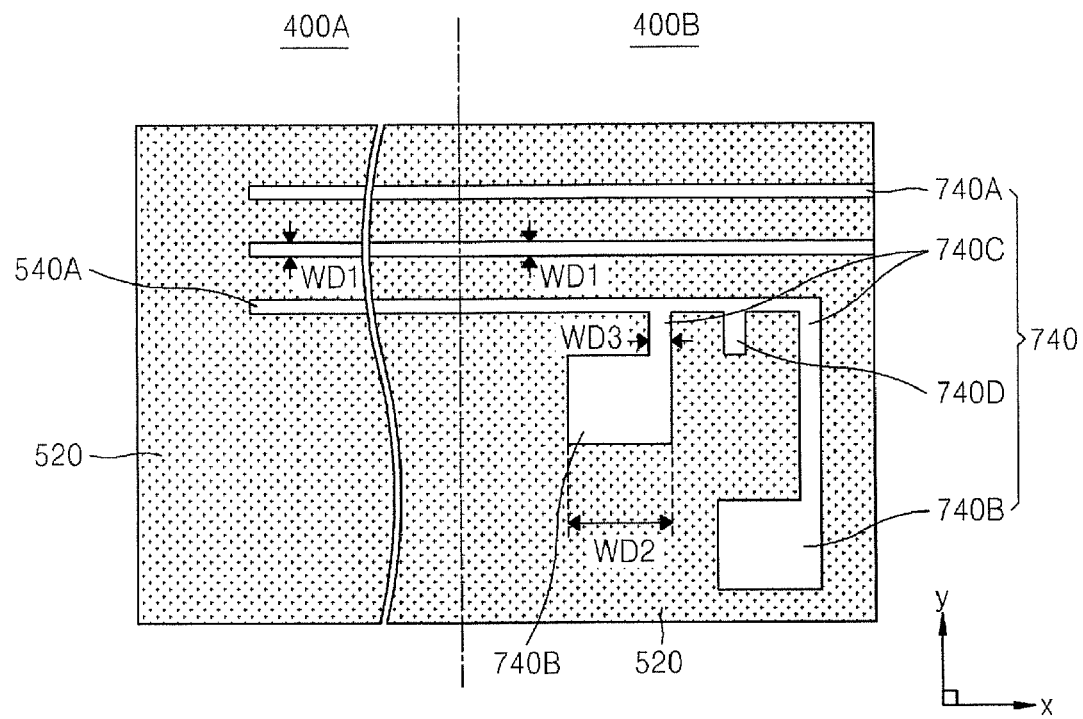
FIGS. 18 through 22 are plan views illustrating a method of forming patterns of a semiconductor device according to still further embodiments of the present invention.

Referring to FIG. 18, a conductive layer 512, a hard mask layer 514, a buffer mask layer 516, a dual mask layer 520, and a variable mask layer 530 are sequentially formed in a memory cell region 400A and a connection region 400B of a substrate 500 as described above with reference to FIGS. 5A and 5B. Next, the mask pattern 740 is formed on the variable mask layer 530 to have a different structure than that of the mask pattern 540 of FIGS. 6A and 6B. The mask pattern 740 includes a first mask portion 740A, a second mask portion 740B, a third mask portion 740C connecting the first mask portion 740A and the second mask portion 740B, and a fourth mask portion 740D for trimming.

Figure 19:
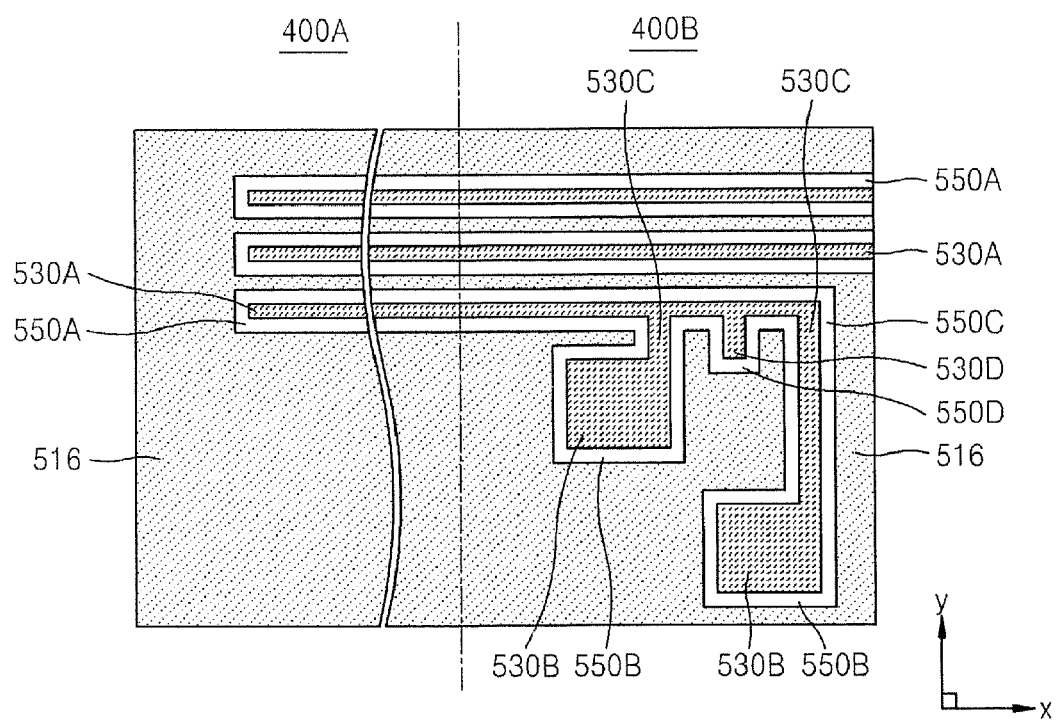

Referring to FIG. 19, first, second, third and fourth variable mask patterns 530A, 530B, 530C, and 530D, and first, second, third and fourth mask patterns 520A, 520B, 520C, and 520D (which are respectively disposed below the first, second, third and fourth variable mask patterns 530A, 530B, 530C, and 530D), are formed on the buffer mask layer 516 by performing the processes described above with reference to FIGS. 6A through 9B. The fourth mask pattern 520A, 520B, 520C and 520D is not illustrated in FIG. 19 since it is entirely covered by the fourth variable mask pattern 530D. Next, a plurality of first through fourth spacers 550A, 550B, 550C, and 550D are formed along the sidewalls of the first, second, third and fourth mask patterns 520A, 520B, 520C, and 520D. The first spacer 550A covers the sidewalls of the first mask pattern 520A, the second spacer 550B covers the sidewalls of the second mask pattern 520B, the third spacer 550C covers the sidewalls of the third mask pattern 520C, and the fourth spacer 550D covers the sidewalls of the fourth mask pattern 520D.

Figure 20:
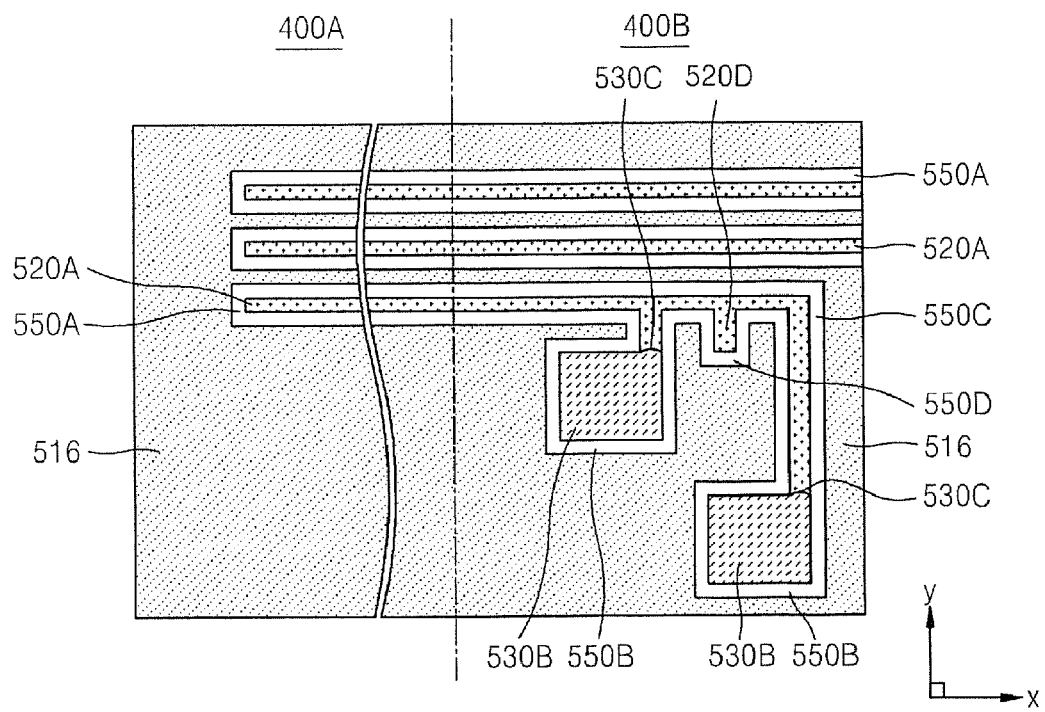

Referring to FIG. 20, the first, third and fourth variable mask patterns 530A, 530C, and 530D are selectively removed by performing the process described above with reference to FIGS. 10A and 10B so that so that the top surfaces of the first, third and fourth mask patterns 520A, 520C, and 520D are exposed.

The amount of etching may be selected so that the fourth variable mask pattern 530D on the fourth mask pattern 520D may be removed together with the third variable mask pattern 530C on the third mask pattern 520C when the first variable etching mask pattern 530A is removed.

Figure 21:
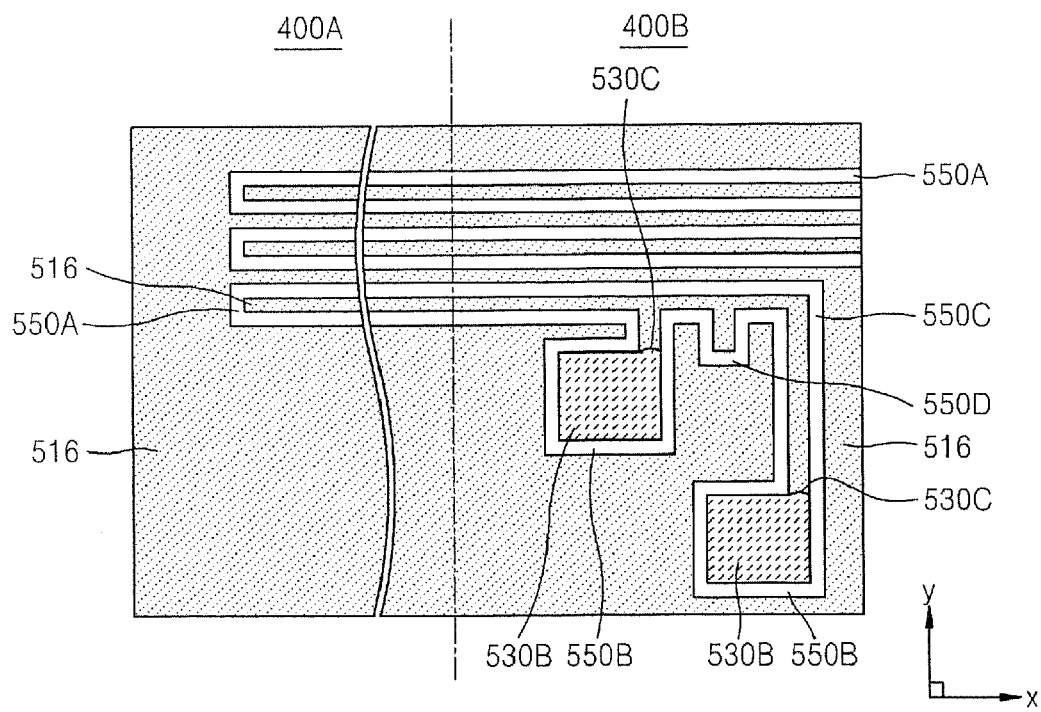

Referring to FIG. 21, the first mask pattern 520A that is exposed in the memory cell region 400A and the connection region 400B is removed using the isotropical etch process as described above with reference to FIGS. 11A and 11B, so that the buffer mask layer 516 is exposed through the space between adjacent first spacers 550A. The third mask pattern 520C and the fourth mask pattern 520D are removed together with the first mask pattern 520A, and thus, only the second mask pattern 520B having a relatively large width may remain from among the first, second, third and fourth mask patterns 520A, 520B, 520C, and 520D.

Figure 22:
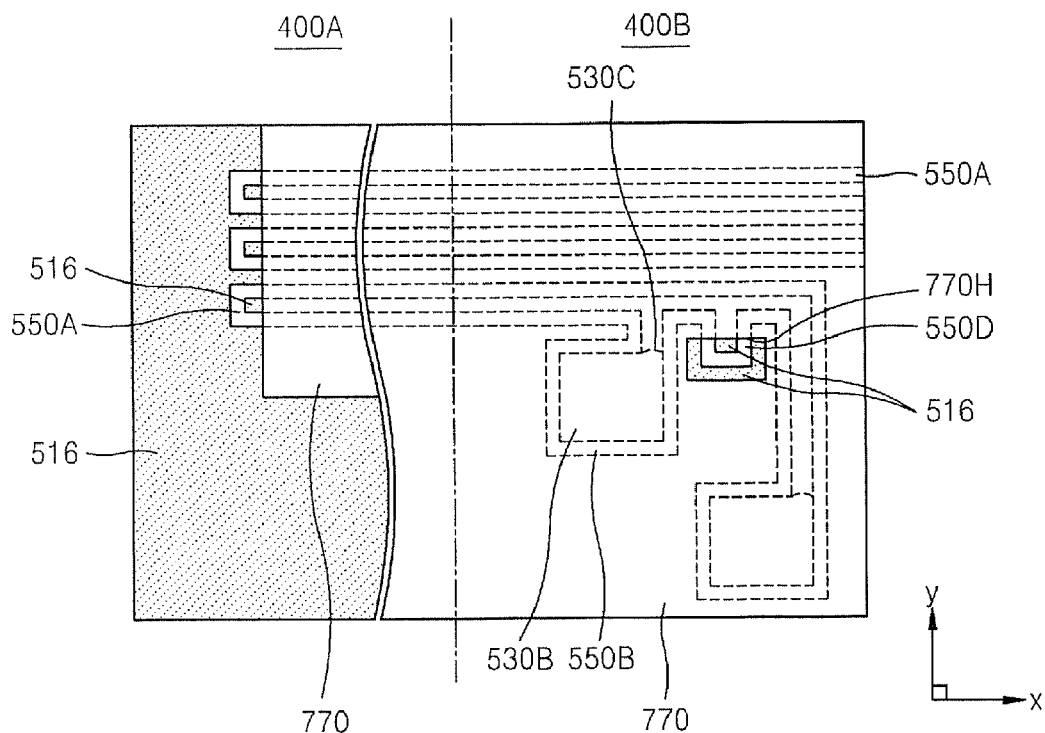

Referring to FIG. 22, the trimming mask pattern 770 is formed on the first, second and third spacers 550A, 550B, and 550C in the memory cell region 400A and the connection region 400B, as described above with reference to FIGS. 12A and 12B.

The trimming mask pattern 770 exposes a portion of the first spacer 550A in the memory cell region 400A similar to the trimming mask pattern 570 of FIG. 12A. However, the trimming mask pattern 770 is different from the trimming mask pattern 570 in that it has an aperture 770H through which the fourth spacer 550D is exposed in the connection region 400B.

The conductive lines 201, 202, . . . , through 232, the contact pads 252 and 254, and the dummy conductive lines 262 and 464 of the semiconductor device 400 may be formed by performing the processes described above with reference to FIGS. 13A through 16B by using the trimming mask pattern 770 as an etch mask.

FIGS. 23A through 24B are plan and cross-sectional views illustrating a method of forming patterns of a semiconductor device, such as the semiconductor device 200 of FIG. 2, according to still further embodiments of the present invention.

Figure 23A:
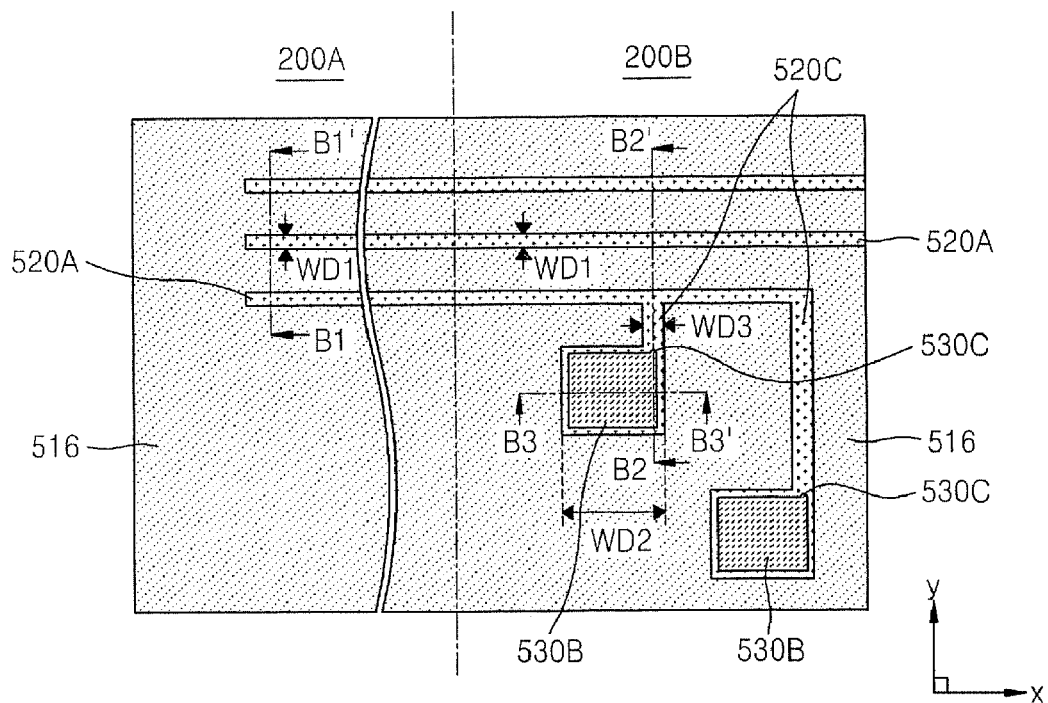
FIGS. 23A through 24B are plan views and cross-sectional views illustrating a method of forming patterns of a semiconductor device according to additional embodiments of the present invention.
Figure 23B:
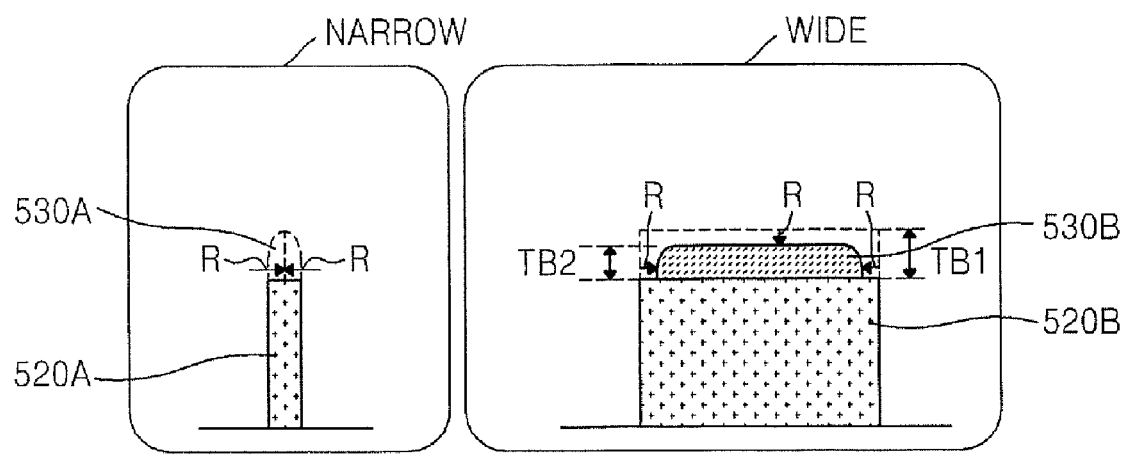
Figure 23B:
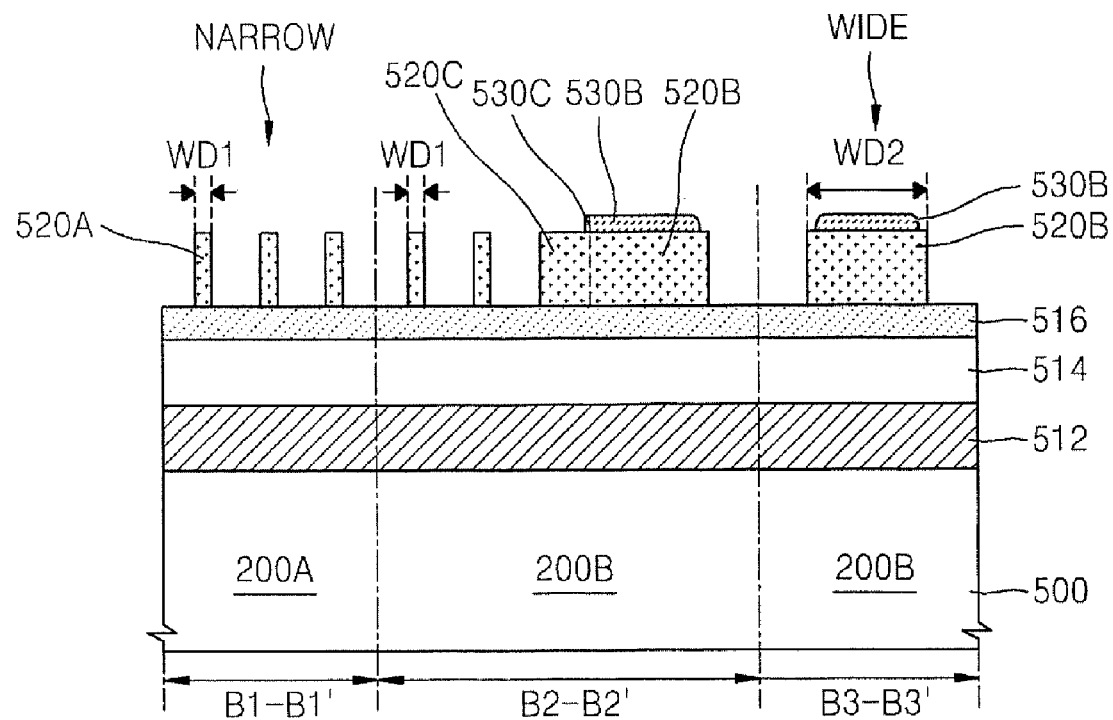
Figure 24A:
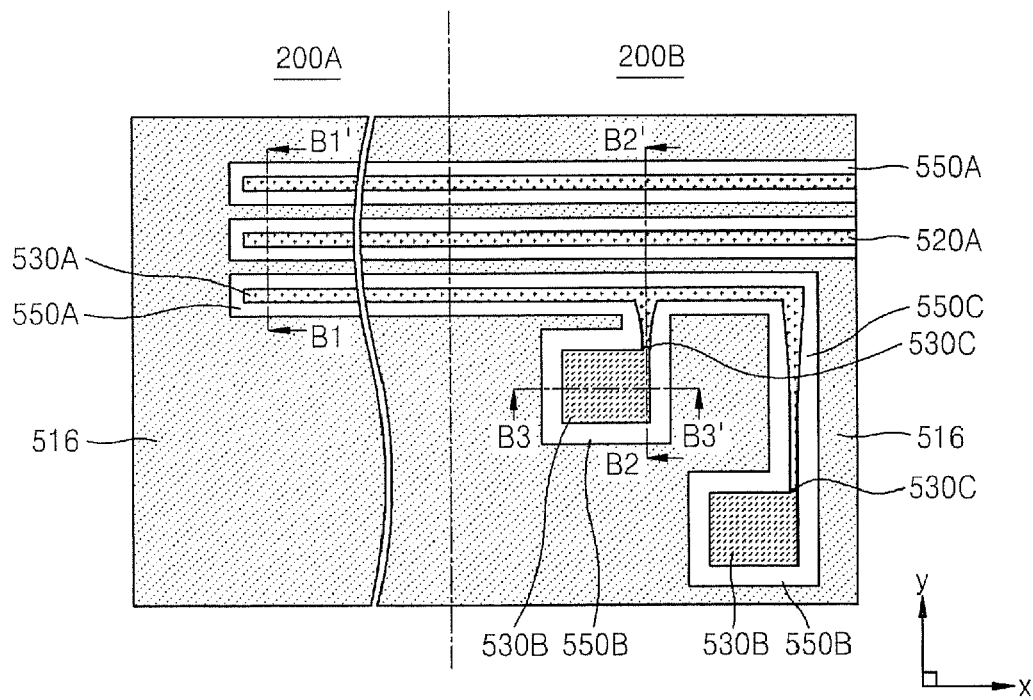
Figure 24B:
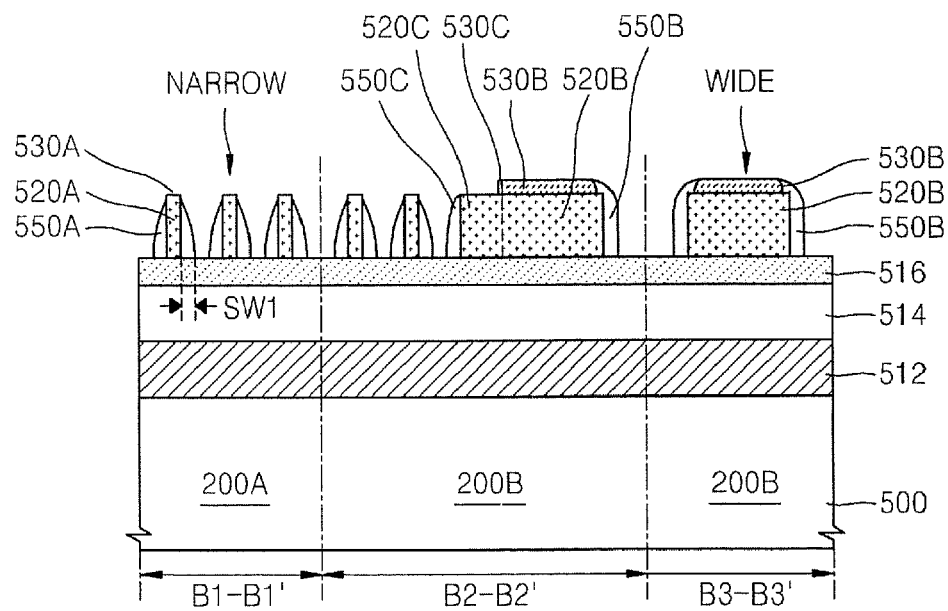

In particular, FIGS. 23A and 24A are plan views of the region indicated by the reference numeral 5A in FIG. 2. FIG. 23B is a cross-sectional view of FIG. 23A taken along the lines B1-B1', B2-B2', and B3-B3'. FIG. 24B is a cross-sectional view of FIG. 24A taken along the lines B1-B1', B2-B2', and B3-B3'.

The method of FIGS. 23A through 24B is similar to the method of FIGS. 5A through 16B except that the processes of FIGS. 5A through 16B are performed and a first variable mask pattern 530A covering the top surface of the first mask pattern 520A is removed before a spacer mask layer 550 is formed as described above with reference to FIGS. 8A and 8B.

In FIGS. 23A through 24B, reference numerals that are the same as those of FIGS. 5A through 16B denote the same elements, and thus, detailed descriptions thereof are not repeated here.

Referring to FIGS. 23A and 23B, the processes described above with reference to FIGS. 5A through 7B are performed. Then, first, second and third variable mask patterns 530A, 530B, and 530C are isotropically etched so that in the resultant structure illustrated in FIGS. 7A and 7B, the second variable mask pattern 530B remains on a second mask pattern 520B and only the first variable mask pattern 530A covering the top surface of the first mask pattern 520A and the second variable mask pattern 530C covering the top surface of the third mask pattern 520C are removed. In this case, the isotropical etching is performed under conditions where the first, second and third variable mask patterns 530A, 530B, and 530C have high etch selectivity with respect to adjacent other layers in order to be selectively etched. For the isotropical etching, a wet or dry etch process may be used. For example, when the first, second and third variable mask patterns 530A, 530B, and 530C are formed of $SiO_2$ or SiON, an HF cleaning solution may be used to isotropically etch only the first, second and third variable mask patterns 530A, 530B, and 530C.

If the first, second and third variable mask patterns 530A, 530B, and 530C are isotropically etched until the first and second variable mask patterns 530A and 530C are removed, then the exposed surfaces of the first, second and third variable mask patterns 530A, 530B, and 530C are evenly etched as indicated with dotted lines and arrows R in a block NARROW of FIG. 23B and a block WIDE of FIG. 23B. Thus, when the first and third variable mask patterns 530A and 530C are completely removed to expose the first mask pattern 520A and the third mask pattern 520C below them, the exposed surface of the second variable mask pattern 530B is abraded by a thickness R, and thus, the edges of the top surface of the second mask pattern 520B are exposed along the edges of the second variable mask pattern 530B. After the first variable mask pattern 530A and the third variable mask pattern 530C are completely removed, the thickness TB1 of the second variable mask pattern 530B before the isotropical etching decreases to a thickness TB2.

Referring to FIGS. 24A and 24B, a spacer mask layer 550 is formed to evenly cover the exposed surfaces of the first mask pattern 520A, the second and third mask patterns 520B and 520C, and the second variable mask patterns 530B as described above with reference to FIGS. 8A and 8B, and a plurality of first to third spacers 550A, 550B, and 550C are formed by etching the spacer mask layer 550 as described above with reference to FIGS. 9A and 9B. The first spacer 550A covers the sidewalls of the first mask pattern 520A, the second spacer 550B covers the sidewalls of the second mask pattern 520B, and the third spacer 550C covers the sidewalls of the third mask pattern 520C. Alternatively, the second spacer 550B may be formed to cover not only the sidewalls of the second mask pattern 520B but also the sidewalls of the second variable mask pattern 530B.

Thereafter, a plurality of conductive patterns 512P may be formed on the substrate 500 as described above with reference to FIGS. 10A through 16B (see FIGS. 16A and 16B). The conductive patterns 512P may form the conductive lines 201, 202, . . . , through 232, the contact pads 252 and 254, and the dummy conductive lines 262 and 264 of the semiconductor device 200 illustrated in FIG. 2.

While the inventive concept has been particularly shown and described with reference to exemplary embodiments thereof, it will be understood that various changes in form and details may be made therein without departing from the spirit and scope of the following claims.

What is claimed is:
1. A semiconductor device comprising:
a plurality of conductive lines each comprising a first line portion and a second line portion, where the first line portion extends on a substrate in a first direction, the second line portion extends from an end of the first line portion in a second direction, and the first direction is different from the second direction;
a plurality of contact pads, each of which is directly connected to the second line portion of a respective one of the plurality of conductive lines; and
a plurality of dummy conductive lines, each of which includes a first dummy portion that extends from one contact pad selected from the plurality of contact pads in the second direction, the first dummy portion extending in a side-by-side relation with the second line portion of the respective one of the plurality of conductive lines.
2. The semiconductor device of claim 1, wherein the plurality of conductive lines include adjacent first and second conductive lines,
the plurality of contact pads include a first contact pad that is directly connected to the first conductive line and a second contact pad that is directly connected to the second conductive line,
the plurality of dummy conductive lines include a first dummy conductive line and a second dummy conductive line,
the first contact pad is directly connected to the first dummy conductive line and the second contact pad is directly connected to the second dummy conductive line, and
the first dummy conductive line has a different shape than the second dummy conductive line.
3. The semiconductor device of claim 2, wherein at least one of the first and second dummy conductive lines includes a second dummy portion that extends from one end of the first dummy portion in a third direction, where the third direction is different from the second direction.
4. The semiconductor device of claim 1, wherein:
the conductive lines comprise adjacent first and second conductive lines,
the contact pads comprise a first contact pad that is directly connected to the first conductive line, and a second contact pad that is directly connected to the second conductive line, and
only one of the first contact pad and the second contact pad is connected to one of the dummy conductive lines.
5. The semiconductor device of claim 4, wherein each of the dummy conductive lines further includes a second dummy portion extending from one end of the first dummy portion in a third direction, where the third direction is different from the second direction.
6. The semiconductor device of claim 1, wherein each of the contact pads includes a linear edge portion extending in the second direction, and
the second line portion of some of the conductive lines extends to form a straight line together with the linear edge portion of a respective one of the contact pads.
7. The semiconductor device of claim 6, wherein each contact pad that has a linear edge portion that together with the second line portion of one of the conductive lines forms a straight line is also connected to a respective one of the dummy conductive lines.
8. The semiconductor device of claim 6, wherein at least one of the plurality of contact pads has a linear edge portion that together with the second line portion of one of the conductive lines forms a straight line, and
wherein the at least one of the plurality of contact pads is not connected to any of the dummy conductive lines.
9. The semiconductor device of claim 8, wherein the at least one of the plurality of contact pads includes a non-linear edge portion adjacent to the second line portion.
10. The semiconductor device of claim 9, wherein the linear edge portion and the non-linear edge portion are spaced apart from each other, and wherein the second line portion is disposed between the linear edge portion and the non-linear edge portion.
11. A semiconductor device comprising:
a plurality of conductive lines each comprising a first line portion and a second line portion, where the first line portion extends on a substrate in a first direction, the second line portion extends from an end of the first line portion in a second direction, and the first direction is different from the second direction;
a plurality of contact pads, each of which is directly connected to the second line portion of a respective one of the plurality of conductive lines; and
a plurality of dummy conductive lines, each of which includes a first dummy portion that extends from one contact pad selected from the plurality of contact pads in the second direction, wherein the conductive lines include adjacent first and second conductive lines, the contact pads comprise a first contact pad that is connected to the first conductive line and a second contact pad that is connected to the second conductive line, each of the first and second contact pads include an edge portion that extends in the second direction, and the second line portion of only one of the first and second conductive lines includes a straight sidewall that extends to form a straight line together with the linear edge portion.

12. The semiconductor device of claim 11, wherein each contact pad that has a linear edge portion that together with the second line portion of one of the conductive lines forms a straight line is also connected to one of the dummy conductive lines.

13. The semiconductor device of claim 11, wherein each contact pad that has a linear edge portion that together with the second line portion of one of the conductive lines forms a straight line is not connected to any of the dummy conductive lines.

14. The semiconductor device of claim 1, wherein each of the contact pads includes a non-linear edge portion that is adjacent to the second line portion of the corresponding conductive line.

15. The semiconductor device of claim 14, wherein, in each of the contact pads, the non-linear edge portion is between the second line portion of the conductive line and the first dummy portion of the dummy conductive line.

16. The semiconductor device of claim 1, wherein the first line portions of the conductive lines extend in parallel with one another while being spaced apart from one another by a first distance, and for each of the plurality of contact pads, the second line portion of the respective conductive line that is connected to the contact pad is spaced apart from the respective dummy conductive line that is connected to the contact pad by a distance that is greater than the first distance.

17. The semiconductor device of claim 1, wherein the conductive lines include adjacent first and second conductive lines, the contact pads comprise a first contact pad that is connected to the first conductive line and a second contact pad that is connected to the second conductive line, and the length of the second line portion of the first conductive line is different from the length of the second line portion of the second conductive line.

18. The semiconductor device of claim 1, wherein the conductive lines comprise a plurality of word lines.

19. The semiconductor device of claim 1, wherein the conductive lines comprise a plurality of bit lines.

20. A semiconductor device comprising:

a plurality of conductive lines each comprising a first line portion and a second line portion, where the first line portion extends on a substrate in a first direction, the second line portion extends from an end of the first line portion in a second direction, and the first direction is different from the second direction;

a plurality of contact pads, each of which is directly connected to the second line portion of a respective one of the plurality of conductive lines, and has an asymmetric shape; and a plurality of dummy conductive lines, each of which includes a first dummy portion that extends from one contact pad selected from the plurality of contact pads in the second direction, the first dummy portion extending in a side-by-side relation with the second line portion of the respective one of the plurality of conductive lines.

* * * * *